(12) United States Patent
Kwon et al.

(10) Patent No.: US 11,127,713 B2
(45) Date of Patent: Sep. 21, 2021

(54) HIGH BANDWIDTH MEMORIES AND SYSTEMS INCLUDING THE SAME

(71) Applicant: Samsung Electronics Co., Ltd., Suwon-si (KR)

(72) Inventors: Youngcheon Kwon, Hwaseong-si (KR); Kyomin Sohn, Yongin-si (KR); Jaeyoun Youn, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/926,189

(22) Filed: Jul. 10, 2020

(65) Prior Publication Data

US 2021/0193615 A1 Jun. 24, 2021

(30) Foreign Application Priority Data

Dec. 20, 2019 (KR) .......................... 10-2019-0171443

(51) Int. Cl.
*H01L 25/065* (2006.01)
*H01L 23/538* (2006.01)
*H01L 21/66* (2006.01)

(52) U.S. Cl.
CPC .......... *H01L 25/0652* (2013.01); *H01L 22/32* (2013.01); *H01L 23/5386* (2013.01); *H01L 25/0657* (2013.01); *H01L 2225/06513* (2013.01); *H01L 2225/06541* (2013.01); *H01L 2225/06596* (2013.01)

(58) Field of Classification Search
CPC combination set(s) only.
See application file for complete search history.

(56) References Cited

U.S. PATENT DOCUMENTS

| 8,063,654 | B2 | 11/2011 | Rahman et al. |
| 8,482,291 | B2 | 7/2013 | Itoh et al. |
| 8,648,615 | B2 | 2/2014 | Rahman |
| 8,799,730 | B2 | 8/2014 | Oh et al. |
| 8,803,308 | B2 | 8/2014 | Ishikawa |
| 9,128,148 | B2 * | 9/2015 | Lowney ............. G01R 31/2896 |
| 9,335,369 | B2 | 5/2016 | Lee |
| 9,459,318 | B2 | 10/2016 | Lee |

(Continued)

FOREIGN PATENT DOCUMENTS

| JP | 2011100898 | 5/2011 |
| JP | 2011257272 | 12/2011 |

(Continued)

*Primary Examiner* — Mamadou L Diallo
(74) *Attorney, Agent, or Firm* — Myers Bigel, P.A.

(57) ABSTRACT

High bandwidth memories and systems including the same may include a buffer die, a plurality of memory dies stacked on the buffer die, a plurality of dummy bump groups in edge regions of the buffer die and the plurality of memory dies, and a plurality of signal line groups. Each of the plurality of dummy bump groups includes dummy bumps spaced apart from each other between each pair of adjacent dies and configured to connect the two adjacent dies to each other. Each of the signal line groups includes a plurality of signal lines configured to transmit a corresponding signal among an input signal and a plurality of bump crack detection signals applied to an input dummy bump of each of the plurality of dummy bump groups via sequential transmission through the plurality of dummy bumps to an output dummy bump during a bump crack test operation.

20 Claims, 12 Drawing Sheets

(56) References Cited

U.S. PATENT DOCUMENTS

| | | | |
|---|---|---|---|
| 9,607,925 | B2 | 3/2017 | Yun et al. |
| 9,640,235 | B2 | 5/2017 | Lee |
| 10,797,037 | B1* | 10/2020 | Lin .................. H01L 25/50 |
| 2006/0232292 | A1 | 10/2006 | Shimizume et al. |
| 2007/0228579 | A1* | 10/2007 | Kang .............. H01L 25/0657 |
| 2011/0204357 | A1 | 8/2011 | Izuha |
| 2012/0305916 | A1* | 12/2012 | Liu .................. H01L 22/30 |
| | | | 257/48 |
| 2013/0052760 | A1 | 2/2013 | Cho et al. |
| 2013/0076387 | A1* | 3/2013 | Ishikawa .......... H01L 25/0657 |
| | | | 324/762.03 |
| 2017/0125360 | A1 | 5/2017 | Lee et al. |
| 2017/0219647 | A1 | 8/2017 | Yun et al. |
| 2017/0309530 | A1 | 10/2017 | Ilkov |
| 2018/0025789 | A1* | 1/2018 | Dono .................. G11C 29/44 |
| | | | 714/719 |
| 2018/0356458 | A1 | 12/2018 | Yun et al. |
| 2019/0278511 | A1* | 9/2019 | Lee .................. G11C 7/1093 |

FOREIGN PATENT DOCUMENTS

| | | |
|---|---|---|
| JP | 2013080750 | 5/2013 |
| JP | 2013083619 | 5/2013 |
| JP | 5609144 | 10/2014 |
| KR | 2013-0022829 | 3/2013 |
| KR | 2017-0051085 | 5/2017 |
| KR | 20170090552 | 8/2017 |
| KR | 2017-012141 | 11/2017 |

* cited by examiner

HIGH BANDWIDTH MEMORIES AND SYSTEMS INCLUDING THE SAME

CROSS-REFERENCE TO THE RELATED APPLICATION

This application claims priority under 35 U.S.C. § 119 from Korean Patent Application No. 10-2019-0171443, filed on Dec. 20, 2019, in the Korean Intellectual Property Office, the disclosure of which is incorporated by reference herein in its entirety.

TECHNICAL FIELD

Aspects of the present disclosure are related to high bandwidth memories and to systems including the same.

BACKGROUND

A high bandwidth memory includes a logic die and a plurality of memory dies stacked on the logic die. A plurality of bumps for transmitting commands, addresses, data, and power may be arranged between a first (e.g., upper) surface of one die and a second (e.g., lower) surface of an adjacent die among the stacked dies.

Bumps at an edge region of the high bandwidth memory may be subject to high stress due to external forces during assembly or delivery processes, and thus, cracks may occur.

SUMMARY

Aspects of the present disclosure are directed to high bandwidth memories and systems including the same for detecting cracks of bumps or in bumps that are in edge regions of a logic die and a plurality of memory dies.

The technical problems solved by embodiments of the inventive concepts disclosed herein are not limited to the above technical problems, and other technical problems which are not described herein will become apparent to those skilled in the art from the following description.

According to some examples of embodiments of the inventive concepts, a high bandwidth memory includes: a buffer die; a plurality of memory dies stacked on the buffer die; a plurality of dummy bump groups in edge regions of the buffer die and the plurality of memory dies, wherein each of the plurality of dummy bump groups comprises the plurality of dummy bumps spaced apart from each other between each pair of adjacent dies and configured to connect the two adjacent dies to each other; and a plurality of signal line groups, each comprising a plurality of signal lines configured to transmit a corresponding signal among an input signal and a plurality of bump crack detection signals, applied to an input dummy bump of the plurality of dummy bumps of each of the plurality of dummy bump groups, to an output dummy bump of the plurality of dummy bumps via sequential transmission through the plurality of dummy bumps during a bump crack test operation, wherein a scan input signal applied to a first terminal of the buffer die is generated as the input signal, signals output through the output dummy bumps of the plurality of dummy bump groups are generated as the plurality of bump crack detection signals, and one selected from the plurality of bump crack detection signals is output to a scan output signal through a second terminal of the buffer die.

According to some examples of embodiments of the inventive concepts, a high bandwidth memory includes: a buffer die; a plurality of memory dies stacked on the buffer die; a plurality of dummy bump groups in edge regions of the buffer die and the plurality of memory dies, wherein each of the plurality of dummy bump groups comprises the plurality of dummy bumps spaced apart from each other and connected between a first surface of one of the pair of adjacent dies and a second surface of the other of the pair of adjacent dies and a plurality of power bumps adjacent to the plurality of dummy bumps and configured to transmit power; and a plurality of signal line groups, each comprising a plurality of signal lines configured to transmit a corresponding signal among an input signal and a plurality of bump crack detection signals, applied to a first surface of an input dummy bump of the plurality of dummy bumps of each of the plurality of dummy bump groups, to an output dummy bump of the plurality of dummy bumps via sequential transmission through the plurality of dummy bumps during a bump crack test operation, wherein the plurality of dummy bumps of each of the plurality of dummy bump groups comprises first dummy bumps and second dummy bumps; wherein the input dummy bump and the output dummy bump are the first dummy bumps adjacent to each other; and wherein the second dummy bumps and the first dummy bumps are alternately arranged from a first side of the input dummy bump to a second side of the output dummy bump.

According to some examples of embodiments of the inventive concepts, a system includes: a printed circuit board (PCB) comprising first direct access terminals; an interposer stacked on the PCB and comprising second direct access terminals; a control device stacked on the PCB; and a high bandwidth memory stacked on the interposer and comprising third direct access terminals, wherein the high bandwidth memory comprises: a buffer die; a plurality of memory dies stacked on the buffer die; a plurality of dummy bump groups in edge regions of the buffer die and the plurality of memory dies, wherein each of the plurality of dummy bump groups comprises the plurality of dummy bumps spaced apart from each other between each pair of adjacent dies and configured to connect the two adjacent dies to each other; and a plurality of signal line groups, each comprising a plurality of signal lines configured to transmit a corresponding signal among an input signal and a plurality of bump crack detection signals, applied to a first surface of an input dummy bump of the plurality of dummy bumps of each of the plurality of dummy bump groups, to a bottom surface of an output dummy bump of the plurality of dummy bumps via sequential transmission through the plurality of dummy bumps during a bump crack test operation, wherein at least one of the first direct access terminals, at least one of the second direct access terminals, and at least one of the third direct access terminals are configured to apply the scan input signal to the input dummy bump, and wherein a scan input signal applied to a first terminal of the buffer die is generated as the input signal, signals output through the output dummy bumps of the plurality of dummy bump groups are generated as the plurality of bump crack detection signals, and one selected from the plurality of bump crack detection signals is output to a scan output signal through a second terminal of the buffer die.

DETAILED DESCRIPTION

Hereinafter, a high bandwidth memory and a high bandwidth memory system including the same according to some examples of embodiments of the inventive concepts will be described with reference to the accompanying drawings.

Figure 1:
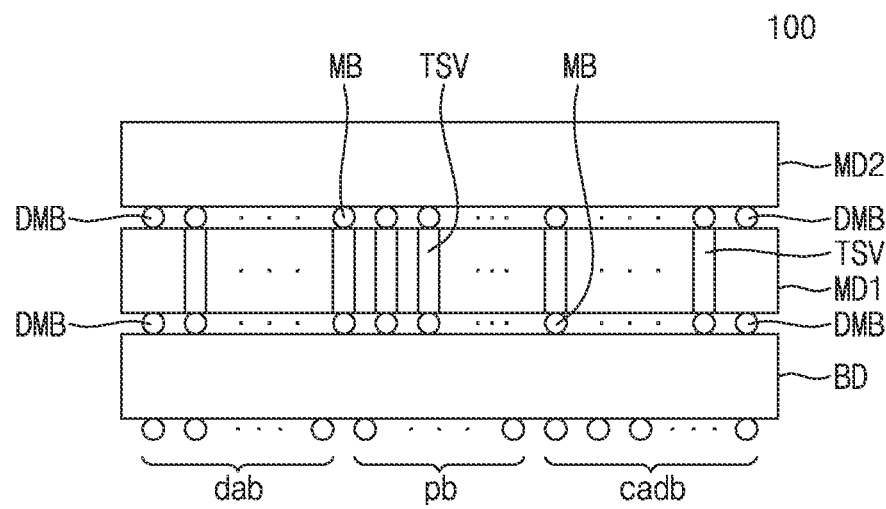
FIG. 1 is a cross-sectional view showing a configuration of a high bandwidth memory according to some examples of embodiments of the inventive concepts.

FIG. 1 is a cross-sectional view showing a configuration of a high bandwidth memory according to some examples of embodiments of the inventive concepts. The high bandwidth memory 100 may include a buffer die BD and first and second memory dies MD1 and MD2 that are stacked on the buffer die BD. The second memory die MD2 may be stacked on the first memory die MD1, and the first memory die MD1 may be stacked on the buffer die BD. The high bandwidth memory 100 may include a plurality of bumps MB between two adjacent dies among the buffer die BD and the memory dies MD1 and MD2. For example, a plurality of bumps MB may be between the first memory die MD1 and the second memory die MD2, and a plurality of bumps MB may be between the first memory die MD1 and the buffer die BD. In other words, bumps MB may be on both sides of the first memory die MD1. The high bandwidth memory 100 may include through silicon vias (TSV) that penetrate the buffer die BD and the memory dies MD1 and MD2. The high bandwidth memory 100 may include a plurality of dummy bumps DMB that are at edge portions between two adjacent dies among the buffer die BD and the memory dies MD1 and MD2. For example, a plurality of dummy bumps DMB may be between the first memory die MD1 and the second memory die MD2, and a plurality of dummy bumps DMB may be between the first memory die MD1 and the buffer die BD. The plurality of dummy bumps DMB may be used to detect cracking of and/or cracks in the plurality of bumps MB. External bumps for connection to external devices may also be provided. For example, direct access bumps dab for direct access (DA) test, power bumps pb for transmitting power, and command and address, and data bumps cadb for transmitting a command and address, and data may be on a surface of the buffer die BD opposite from the memory dies MD1 and MD2.

Although FIG. 1 illustrates an example in which two memory dies MD1 and MD2 are stacked on the buffer die BD, the present disclosure is not limited thereto, and three or more than three memory dies may be stacked and configured in some examples of embodiments.

Figure 2A:
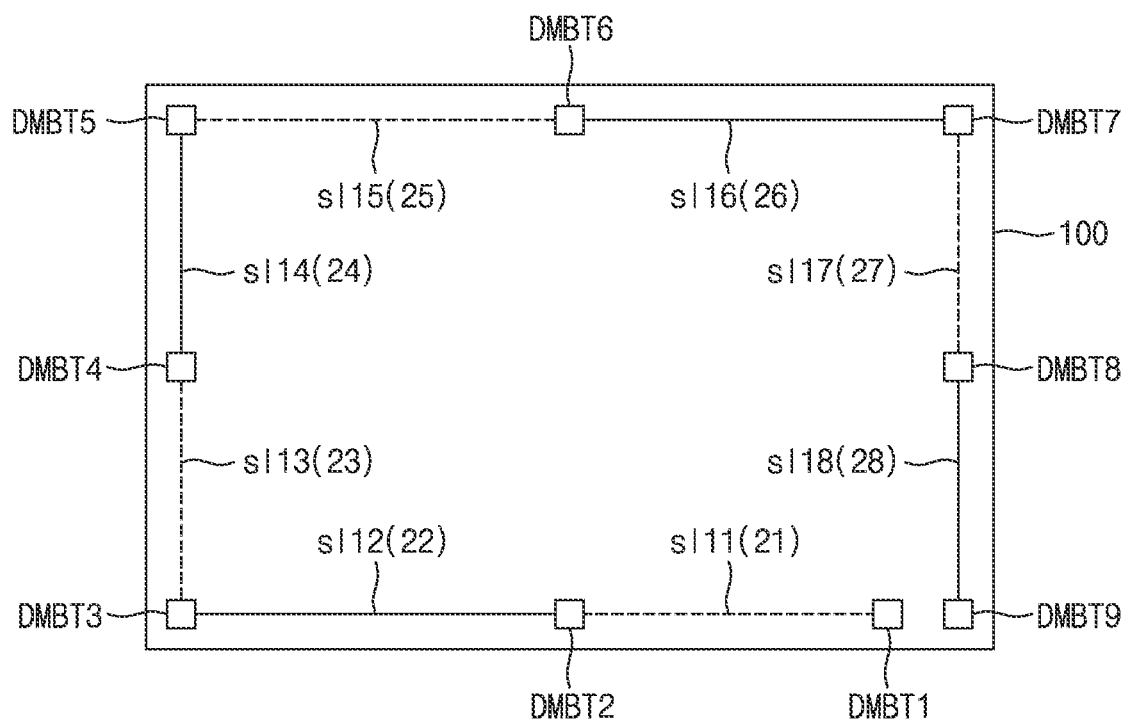
FIGS. 2A and 2B are diagrams showing arrangement of dummy bumps and signal lines of a high bandwidth memory according to some examples of embodiments of the inventive concepts.
Figure 2B:
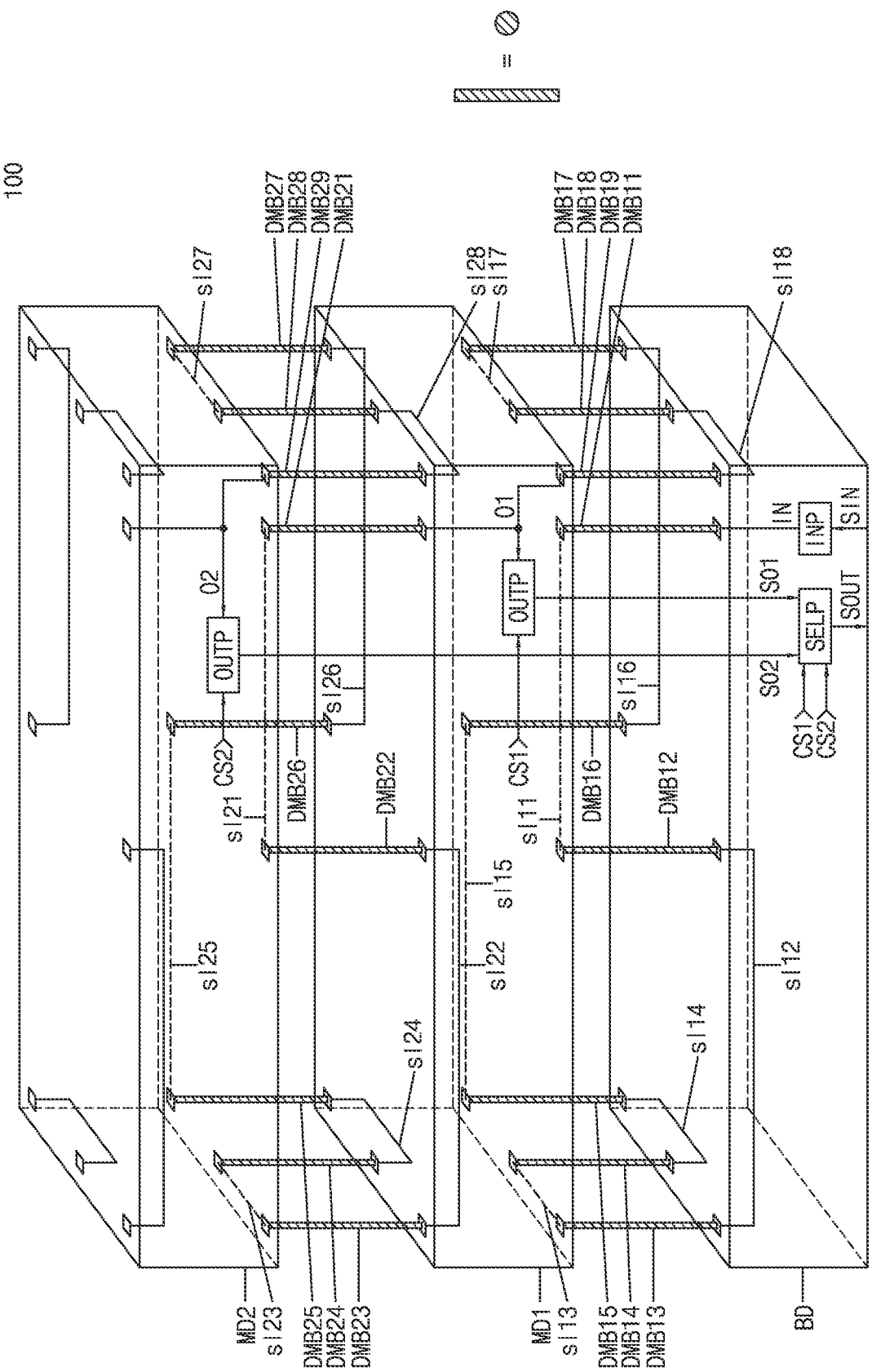

FIGS. 2A and 2B are diagrams showing arrangement of dummy bumps and signal lines of a high bandwidth memory according to some examples of embodiments of the inventive concepts. FIG. 2A is a top view showing arrangement of the dummy bumps and the signal lines of the high bandwidth memory according to some examples of embodiments of the inventive concepts. FIG. 2B is a lateral perspective view showing arrangement and some components of the dummy bumps and the signal lines of the high bandwidth memory according to some examples of embodiments of the inventive concepts. The high bandwidth memory illustrated in FIGS. 2A and 2B may correspond to the buffer die BD and the two memory dies MD1 and MD2 of the high bandwidth memory 100 illustrated in FIG. 1. In FIGS. 2A and 2B, signal lines connected to top surfaces of the dummy bumps are indicated by solid lines, and signal lines connected to bottom surfaces of the dummy bumps are indicated by dotted lines.

Referring to FIGS. 2A and 2B, dummy bump terminals DMBT1 to DMBT9 (e.g., pads) may be arranged and spaced apart from one another at positions of edge portions of a top surface of the buffer die BD, and edge regions of top surfaces and of bottom surfaces of the memory dies MD1 and MD2, which overlap each other. Dummy bumps DMB11 to DMB19 may be between the dummy bump terminals DMBT1 to DMBT9 of a top surface of the buffer die BD and the dummy bump terminals DMBT1 to DMBT9 of a bottom surface of the first memory die MD1. Dummy bumps DMB21 to DMB29 may be between the dummy bump terminals DMBT1 to DMBT9 of a top surface of the first memory die MD1 and the dummy bump terminals DMBT1 to DMBT9 of a bottom surface of the second memory die MD2. The dummy bumps DMB11 to DMB19 may include first dummy bumps DMB11, DMB13, DMB15, DMB17, and DMB19, and second dummy bumps DMB12, DMB14, DMB16, and DMB18. The dummy bumps DMB21 to DMB29 may include first dummy bumps DMB21, DMB23, DMB25, DMB27, and DMB29, and second dummy bumps DMB22, DMB24, DMB26, and DMB28. One first dummy bump (e.g., DMB11 or DMB21) may be an input dummy bump, and another first dummy bump (e.g., DMB19 or DMB29) adjacent to the input dummy bump may be an output dummy bump. In addition, the second dummy bumps and the remaining first dummy bumps may be alternately disposed around a perimeter of the high bandwidth memory 100 and dies thereof, with the alternation beginning (for example) with a second dummy bump at a first (e.g., right) side of the input dummy bump DMB11 or DMB21 and ending with a second dummy bump at a second (e.g., left) side of the output dummy bumps DMB19 or DMB29.

Top surfaces of two dummy bumps (DMB11, DMB12), (DMB13, DMB14), (DMB15, DMB16), (DMB17, DMB18) that are adjacent to each other between a top surface of the buffer die BD and a bottom surface of the memory die MD1 may be connected to each other through first signal lines sl11, sl13, sl15, and sl17, respectively, inside or on a bottom surface of the memory die MD1. In addition, bottom surfaces of two dummy bumps (DMB12, DMB13), (DMB14, DMB15), (DMB16, DMB17), (DMB18, DMB19) that are adjacent to each other between the top surface of the buffer die BD and the bottom surface of the memory die MD1 may be connected to each other through second signal lines sl12, sl14, sl16, and sl18, respectively, inside or on a top surface of the buffer die BD. Stated differently, the first signal lines sl11, sl13, sl15, and sl17 may connect respectively the top surfaces of the first dummy bumps DMB11, DMB13, DMB15, and DMB17 to top surfaces of the second dummy bumps DMB12, DMB14, DMB16, and DMB18, which are respectively adjacent to the first dummy bumps DMB11, DMB13, DMB15, and DMB17. The second signal lines sl12, sl14, sl16, and sl18 may connect respectively the bottom surfaces of the second dummy bumps DMB12, DMB14, DMB16, and DMB18 to bottom surfaces of the first dummy bumps DMB13, DMB15, DMB17, and DMB19, which are respectively adjacent to the second dummy bumps DMB12, DMB14, DMB16, and DMB18. As a result, the first and second signal lines sl11 to sl18 may be configured to output a signal applied from a bottom surface of the input dummy bump DMB11 among the dummy bumps DMB11 to DMB19 to a bottom surface of the output dummy bump DMB19 sequentially through the dummy bumps DMB11 to DMB19.

Similarly, top surfaces of two dummy bumps (DMB21, DMB22), (DMB23, DMB24), (DMB25, DMB26), (DMB27, DMB28) that are adjacent to each other between the top surface of the memory die MD1 and the bottom surface of the memory die MD2 may be connected to each other through first signal lines sl21, sl23, sl25, and sl27, respectively, inside or on a bottom surface of the memory die MD2. In addition, bottom surfaces of two dummy bumps (DMB22, DMB23), (DMB24, DMB25), (DMB26, DMB27), (DMB28, DMB29) that are adjacent to each other between the top surface of the memory die MD1 and the bottom surface of the memory die MD2 may be connected to each other through second signal lines sl22, sl24, sl26, and sl28, respectively, inside or on a top surface of the memory die MD1. That is, the first signal lines sl21, sl23, sl25, and sl27 may connect respectively the top surfaces of the first dummy bumps DMB21, DMB23, DMB25, and DMB27 to top surfaces of the second dummy bumps DMB22, DMB24, DMB26, and DMB28, which are respectively adjacent to the first dummy bumps DMB21, DMB23, DMB25, and DMB27. The second signal lines sl22, sl24, sl26, and sl28 may connect respectively the bottom surfaces of the second dummy bumps DMB22, DMB24, DMB26, and DMB28 to bottom surfaces of the first dummy bumps DMB23, DMB25, DMB27, and DMB29, which are respectively adjacent to the second dummy bumps DMB22, DMB24, DMB26, and DMB28. As a result, the first and second signal lines sl21 to sl28 may be configured to output a signal applied from a bottom surface of the input dummy bump DMB21 among the dummy bumps DMB21 to DMB29 to a bottom surface of the output dummy bump DMB29 sequentially through the dummy bumps DMB21 to DMB29.

Although the dummy bumps DMB11 to DMB19 and DMB21 to DMB29 are illustrated as slashed pillars having a columnar shape, FIG. 2B, the dummy bumps DMB11 to DMB19 and DMB21 to DMB29 may each have a ball type illustrated in FIG. 1 and may be micro bumps.

Referring to FIG. 2B, the buffer die BD may include a selector SELP and an input unit INP. The selector SELP may select a first scan output signal SO1 in response to a first selection signal CS1, may select a second scan output signal SO2 in response to a second selection signal CS2, and may output a scan output signal SOUT to an external test device, during a bump crack test operation. The input unit INP may receive a scan input signal SIN applied from a test device and may output an input signal IN to the input dummy bump DMB11 during the bump crack test operation.

Referring to FIG. 2B, the memory die MD1 may include an output unit OUTP. The output unit OUTP may generate a first bump crack detection signal O1 as the first scan output signal SO1 in response to the first selection signal CS1 during the bump crack test operation. The first scan output signal SO1 may be transmitted through one of data bumps (not shown) for transmitting data between the buffer die BD and the memory die MD1.

Referring to FIG. 2B, the memory die MD2 may include the output unit OUTP. The output unit OUTP may generate a second bump crack detection signal O2 as the second scan output signal SO2 as a second bump crack detection signal O2 in response to the second selection signal CS2 during the bump crack test operation. The second scan output signal SO2 may be transmitted through one of data bumps (not shown) for transmitting data between the buffer die BD and the memory die MD2.

Figure 3A:
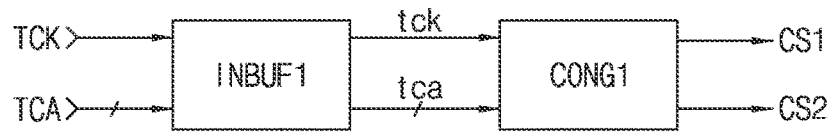
FIG. 3A shows a configuration of a controller of a buffer die according to some examples of embodiments of the inventive concepts.
Figure 3B:
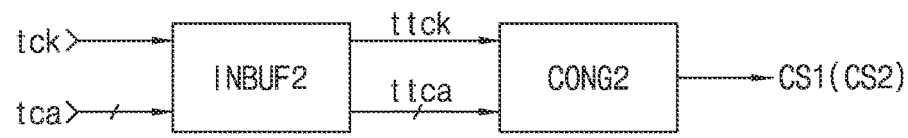
FIG. 3B shows a configuration of a controller of each memory die according to some examples of embodiments of the inventive concepts.

FIG. 3A shows a configuration of a controller of a buffer die BD according to some examples of embodiments of the inventive concepts. FIG. 3B shows a configuration of a controller of each memory die MD1 and MD2 according to some examples of embodiments of the inventive concepts. A controller of each of the buffer die BD and the memory dies MD1 and MD2 may include an input buffer INBUF1 or INBUF2 and a control signal generator CONG1 or CONG2.

Referring to FIG. 3A, the input buffer INBUF1 may buffer a test clock signal TCK and a test command and address TCA to generate the buffered test clock signal tck and the buffered test command and address tca. A control signal generator CONG1 may receive the buffered test command and address tca and may generate the first selection signal CS1 and the second selection signal CS2 in response to the buffered test clock signal tck. The buffered test clock signal tck and the buffered test command and address tca may be transmitted through bumps (not shown) for transmitting a command and address between the buffer die BD and the memory die MD1, and may be transmitted through bumps (not shown) for transmitting a command and address between the buffer die BD and the memory die MD2.

Referring to FIG. 3B, the input buffer INBUF2 may buffer the buffered clock signal tck and the buffered test command and address tca and may generate a buffered clock signal ttck and a buffered test command and address ttca. The control signal generator CONG2 may receive the buffered test command and address ttca and may generate the first selection signal CS1 (the second selection signal CS2) in response to the buffered clock signal ttck.

Figure 4A:
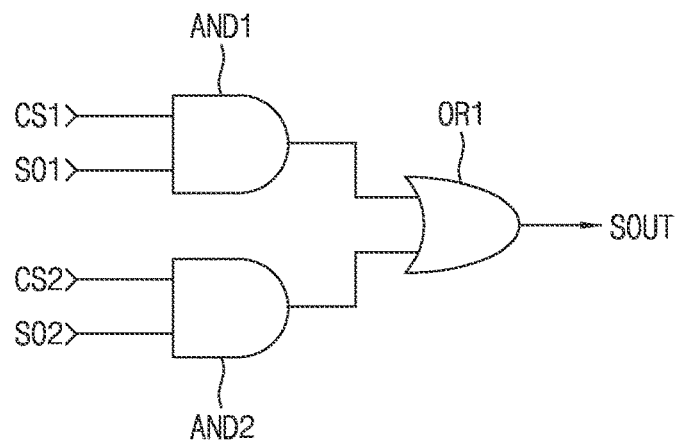
FIG. 4A is a diagram showing a configuration of a selector of a buffer die of a high bandwidth memory according to some examples of embodiments of the inventive concepts.

FIG. 4A is a diagram showing a configuration of a selector SELP of a buffer die of a high bandwidth memory according to some examples of embodiments of the inventive concepts. The selector SELP may include first and second AND gates AND1 and AND2 and a first OR gate OR1.

In FIG. 4A, the first AND gate AND1 may output the first scan output signal SO1 when the first selection signal CS1 is activated and is at a "high" level. The second AND gate AND2 may output the second scan output signal SO2 when the second selection signal CS2 is activated and is at a "high" level. The first OR gate OR1 may generate the first scan output signal SO1 or the second scan output signal SO2 as a scan output signal SOUT.

Figure 4B:
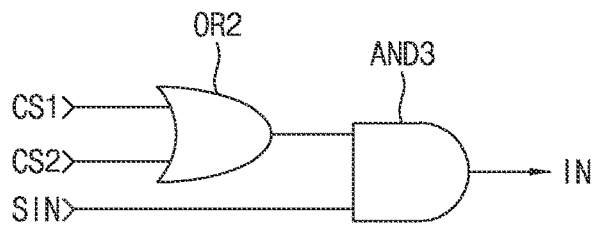
FIG. 4B is a diagram showing a configuration of a buffer die of a high bandwidth memory according to some examples of embodiments of the inventive concepts.

FIG. 4B is a diagram showing a configuration of an input unit INP of a buffer die of a high bandwidth memory according to some examples of embodiments of the inventive concepts. The input unit INP may include a second OR gate OR2 and a third AND gate AND3.

In FIG. 4B, the second OR gate OR2 may generate a signal at a "high" level when the first selection signal CS1 or the second selection signal CS2 is activated and is at a "high" level. The third AND gate AND3 may generate the scan input signal SIN as the input signal IN when a signal at a "high" level is generated from the second OR gate OR2.

Figure 4C:
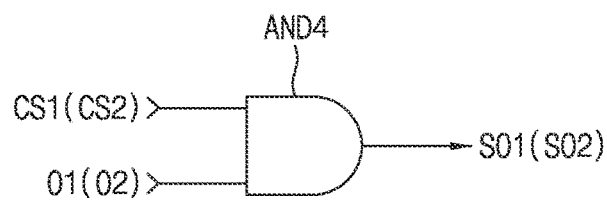
FIG. 4C is a diagram showing a configuration of an output unit of each memory die of a high bandwidth memory according to some examples of embodiments of the inventive concepts.

FIG. 4C is a diagram showing a configuration of an output unit OUTP of each memory die of a high bandwidth memory according to some examples of embodiments of the inventive concepts. The output unit OUTP may include a fourth AND gate AND4.

In FIG. 4C, the fourth AND gate AND4 may generate the respective scan output signal (the first scan output signal SO1 for the first memory die MD1 and the second scan output signal SO2 for the second memory die MD2) when the respective selection signal (e.g., the first selection signal CS1 or the second selection signal CS2) is activated and is at a "high" level.

Figure 5A:
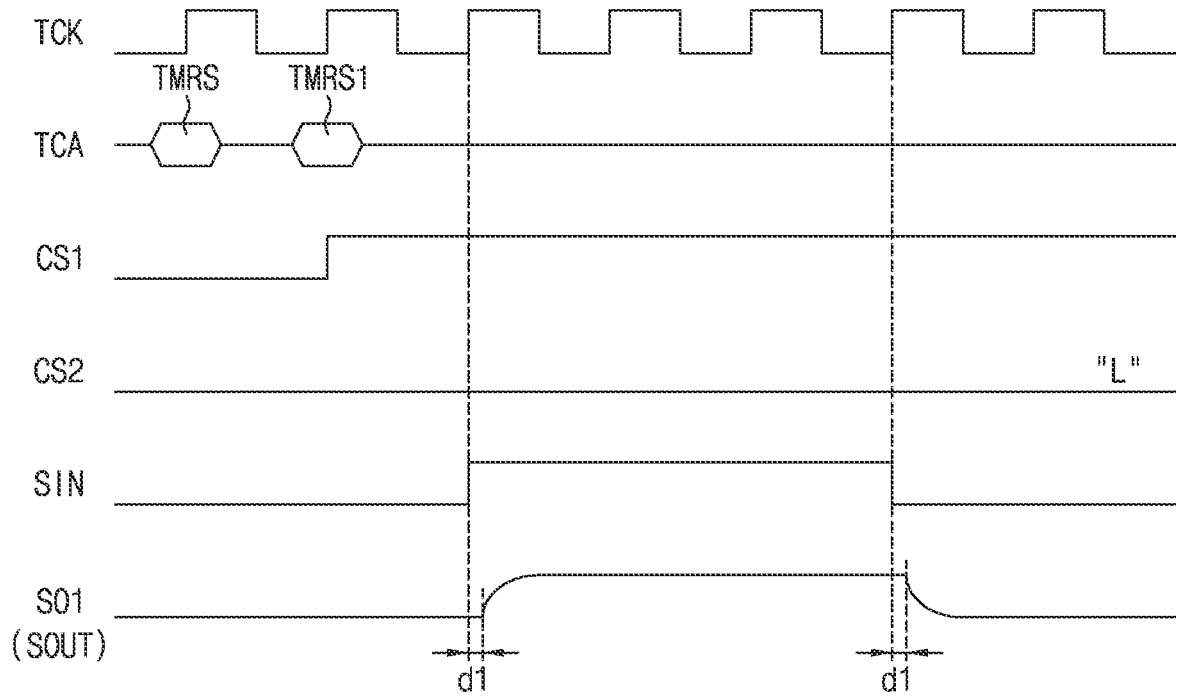
FIGS. 5A and 5B are operation timing diagrams for explaining a bump crack detection operation of a high bandwidth memory according to some examples of embodiments of the inventive concepts.
Figure 5B:
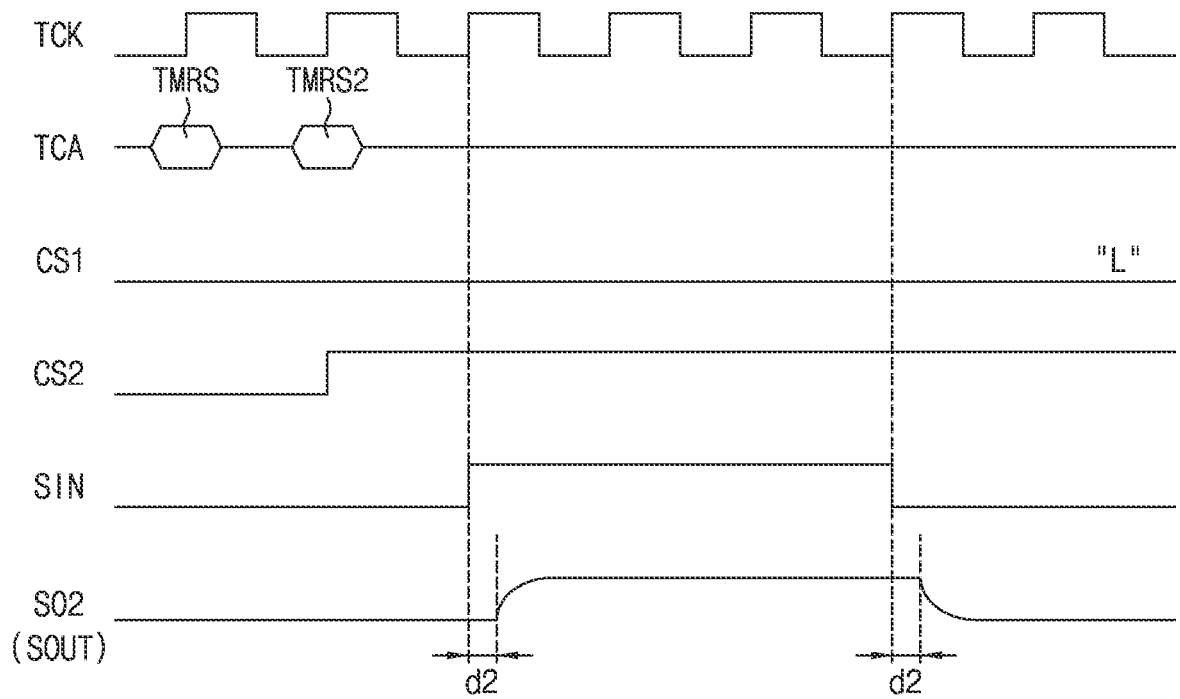

FIGS. 5A and 5B are operation timing diagrams for explaining a bump crack detection operation of a high bandwidth memory according to some examples of embodiments of the inventive concepts.

Referring to FIGS. 5A and 5B, the test clock signal TCK and a test command and address TCA that are applied from an external test device (not shown) may be received, and when the test command and address TCA is a test mode entry code TMRS, the high bandwidth memory may enter a test mode. The test clock signal TCK and the test command and address TCA may be applied through input bumps (or input pads) among the direct access bumps dab (seen best in FIG. 1) or may be applied through pads (not shown).

Referring to FIGS. 1 to 5A, after entering the test mode, when the test command and address TCA is a first test mode setting code TMRS1, the first selection signal CS1 at a "high" level may be generated, and the second selection signal CS2 at a "low" level may be generated. The control signal generator CONG2 of the memory die MD1 may receive the buffered test clock signal ttck and a buffered command and address ttca to generate the first selection signal CS1 at a "high" level and the control signal generator CONG2 of the memory die MD2 may receive the buffered test clock signal ttck and the buffered command and address ttca to generate the second selection signal CS2 at a "low" level. Then, when the scan input signal SIN is applied to the input unit INP of the buffer die BD from an external test device (not shown), the input unit INP may receive the scan input signal SIN and may transmit the scan input signal SIN to the dummy bump DMB11. Thus, the scan input signal SIN may be transmitted through the dummy bump DBM11, the signal line sl11, the dummy bump DMB12, the signal line sl12, ..., the signal line sl18, and the dummy bump DMB19 and the first bump crack detection signal O1 may be generated. The scan input signal SIN may be a pulse signal that is applied through an input bump (or a pad) among the direct access bumps dab (refer to FIG. 1) (or pads (not shown)). When all the dummy bumps DMB11 to DMB19 are not open (i.e., are not cut) and are normal, the first scan output signal SO1 and the scan output signal SOUT may be generated by delaying the scan input signal SIN by a first predetermined time d1. The scan output signal SOUT may be output to an external test device (not shown) through an output bump (or a pad) among the direct access bumps dab (best seen in FIG. 1) or pads (not shown).

Referring to FIGS. 1 to 5B, after entering the test mode, when the test command and address TCA is a second test mode setting code TMRS2, the first selection signal CS1 at a "low" level may be generated, and the second selection signal CS2 at a "high" level may be generated. The control signal generator CONG2 of the memory die MD1 may receive the buffered test clock signal ttck and the buffered command and address ttca to generate the first selection signal CS1, and the control signal generator CONG2 of the memory die MD2 may receive the buffered test clock signal ttck and the buffered command and address ttca to generate the second selection signal CS2 at a "high" level. Then, when the scan input signal SIN is applied to the input unit INP of the buffer die BD from an external test device (not shown), the input unit INP may receive the scan input signal SIN and may transmit the input signal IN to the dummy bump DMB11. Thus, the scan input signal SIN may be transmitted through the dummy bump DBM11, the signal line sl11, the dummy bump DMB12, the signal line sl12, ..., the signal line sl18, and the dummy bump DMB19 to generate the first bump crack detection signal O1, and the first bump crack detection signal O1 may be transmitted through a dummy bump DBM21, the signal line sl21, the dummy bump DMB22, the signal line sl21, ..., the signal line sl28, and the dummy bump DMB29 to generate the second bump crack detection signal O2. The scan input signal SIN may be a pulse signal, and when all of the dummy bumps DMB11 to DMB19 and DMB21 to DMB29 are not open (i.e., are not cut) and are normal, the second scan output signal SO2 may be generated by delaying the scan input signal SIN by a second predetermined time d2.

When the first scan output signal SO1 is normal and the second scan output signal SO2 is abnormal, an external test device (not shown) may determine that at least one of the dummy bumps DMB21 to DMB29 is abnormal.

Figure 6A:
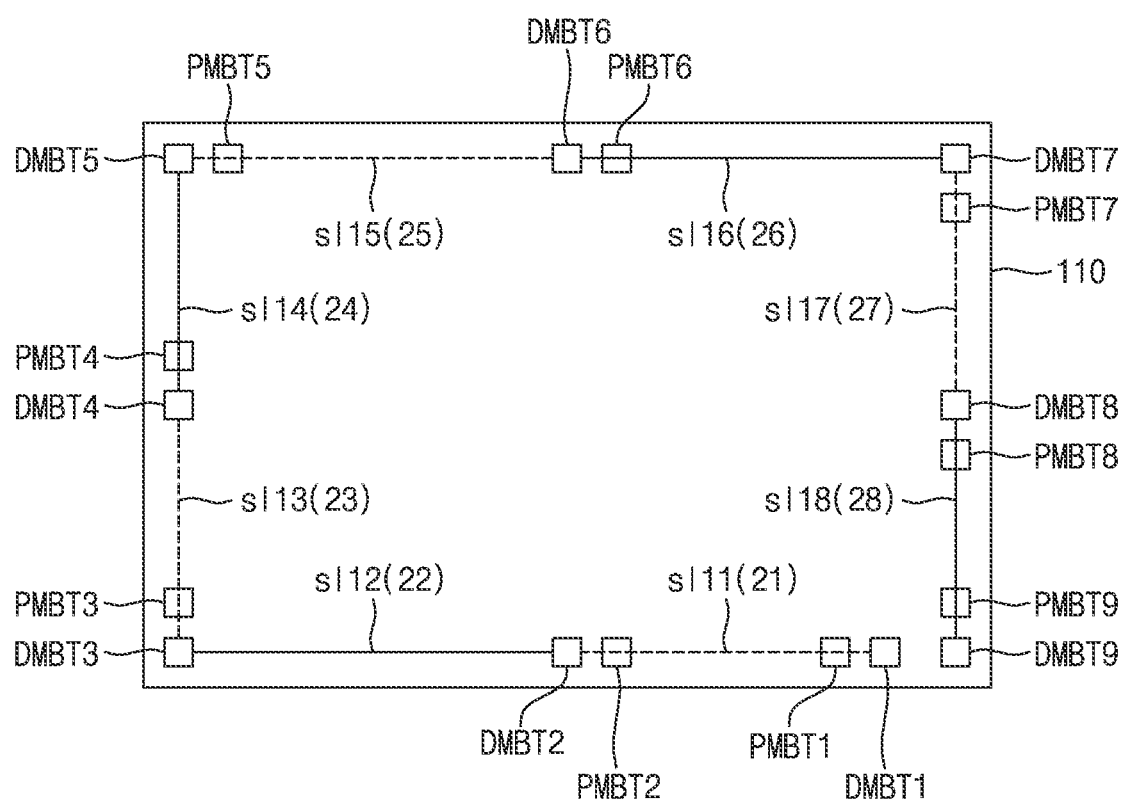
FIGS. 6A and 6B are diagrams showing arrangement of dummy bumps, power bumps, and signal lines of a high bandwidth memory according to some examples of embodiments of the inventive concepts.
Figure 6B:
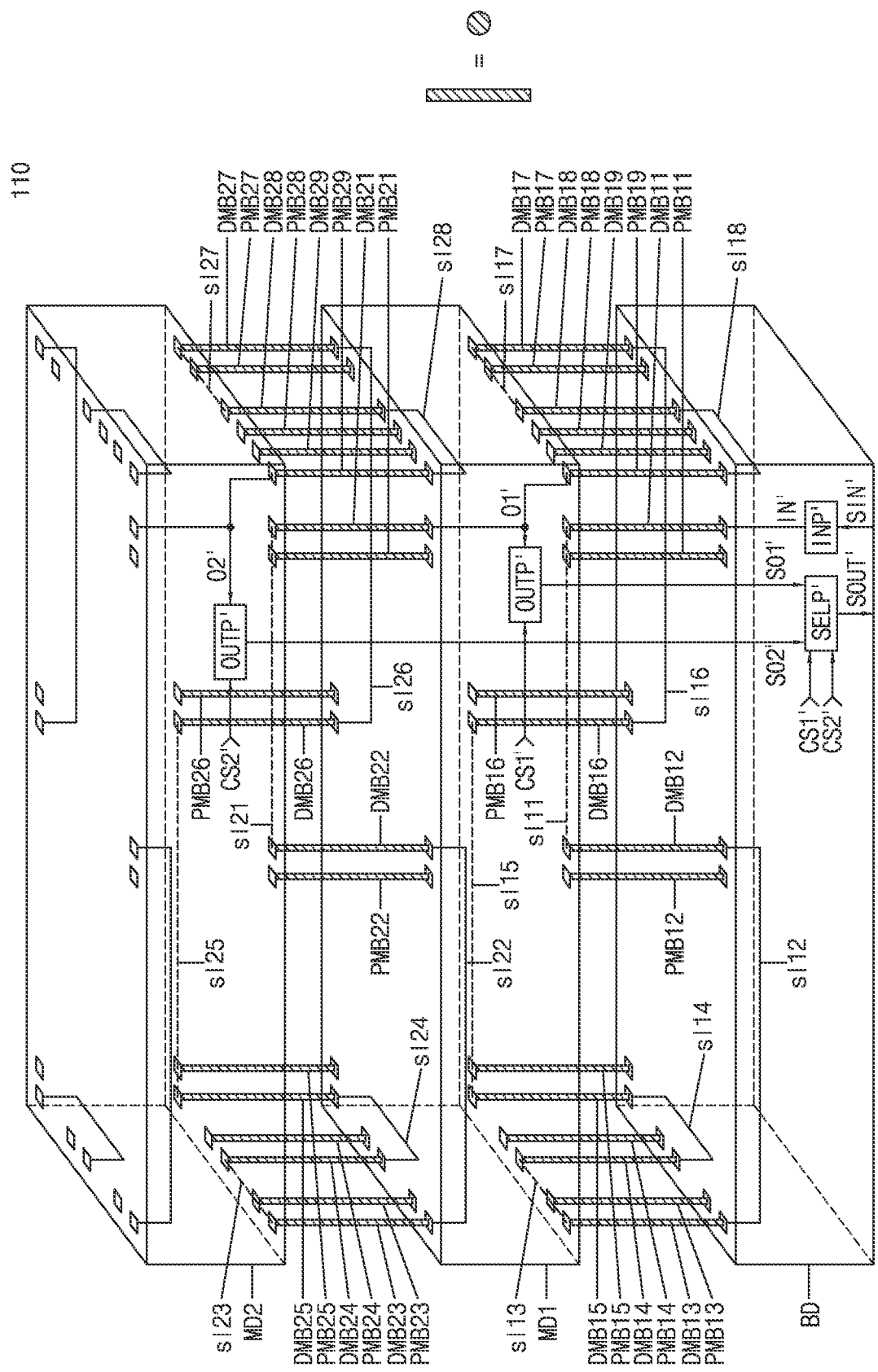

FIGS. 6A and 6B are diagrams showing arrangement of dummy bumps, power bumps, and signal lines of a high bandwidth memory according to some examples of embodiments of the inventive concepts. FIG. 6A is a top view showing arrangement of the dummy bumps, the power bumps, and the signal lines of the high bandwidth memory according to some examples of embodiments of the inventive concepts. FIG. 6B is a lateral perspective view showing arrangement and some components of the dummy bumps, the power bumps, and the signal lines of the high bandwidth memory according to embodiments of the inventive concepts. A high bandwidth memory 110 illustrated in FIGS. 6A and 6B may correspond to the buffer die BD and the two the memory dies MD1 and MD2 of the high bandwidth memory 100 illustrated in FIG. 1. In FIGS. 6A and 6B, signal lines connected to top surfaces of the dummy bumps are indicated by solid lines, and signal lines connected to bottom surfaces of the dummy bumps are indicated by dotted lines.

Referring to FIGS. 6A and 6B, the high bandwidth memory 110 may include the dummy bumps DMB11 to DMB19 and DMB21 to DMB29 and signal lines sl11 to sl18 and sl21 to sl28 which have the same arrangement as that of FIGS. 2A and 2B. In addition, the high bandwidth memory 110 may include power bump terminals PMBT1 to PMBT9 (e.g., pads) adjacent to the dummy bump terminals DMBT1 to DMBT9 that are arranged and spaced apart from one another at positions of edge portions of a top surface of the buffer die BD, and edge regions of top surfaces and bottom surfaces of the memory dies MD1 and M2. Power bumps PMB11 to PMB19 may be between the power bump terminals PMBT1 to PMBT9 of a top surface of the buffer die and the power bump terminals PMBT1 to PMBT9 of a bottom surface of the first memory die MD1, and power bumps PMB21 to PMB29 may be between the power bump terminals PMBT1 to PMBT9 of a top surface of the first memory die MD1 and the power bump terminals PMBT1 to PMBT9 of a bottom surface of the second memory die MD2. The power bumps PMB11 to PMB19 and the power bumps PMB21 to PMB29 may be dummy power bumps that are further added to detect crack of bumps, or may be power bumps that are substantially present on product specification (or standard). In the case of dummy power bumps, power supplied from the inside (or a top surface or a bottom surface) of the dies BD, MD1, and MD2 may be applied to dummy power bumps.

Referring to FIG. 6B, the buffer die BD may include a selector SELP' and an input unit INP'. The selector SELP' may select a third scan output signal SO1' in response to a third selection signal CS1', may select a fourth scan output signal SO2' in response to a fourth selection signal CS2', and may output a scan output signal SOUT' to an external test device, during a bump crack test operation. The input unit INP' may receive a scan input signal SIN' applied from a test device and may output an input signal IN' to the dummy bump DMB11 during a bump crack test operation.

Referring to FIG. 6B, the memory die MD1 may include an output unit OUTP'. The output unit OUTP' may generate a third bump crack detection signal O1' as the third scan output signal SO1' in response to the third selection signal CS1' during the bump crack test operation. The third scan output signal SO1' may be transmitted through one of data bumps (not shown) for transmitting data between the buffer die BD and the memory die MD1.

Referring to FIG. 6B, the memory die MD2 may include the output unit OUTP'. The output unit OUTP' may generate a fourth bump crack detection signal O2' as the fourth scan output signal SO2' in response to the fourth selection signal CS2' during the bump crack test operation. The fourth scan output signal SO2' may be transmitted through one of data bumps (not shown) for transmitting data between the buffer die BD and the memory die MD2.

Figure 7A:
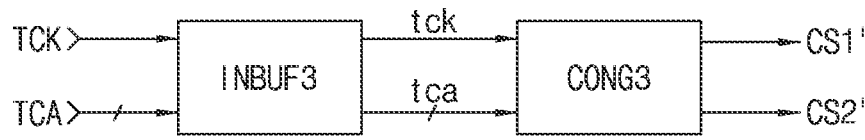
FIG. 7A shows a configuration of a controller of a buffer die according to some examples of embodiments of the inventive concepts.
Figure 7B:
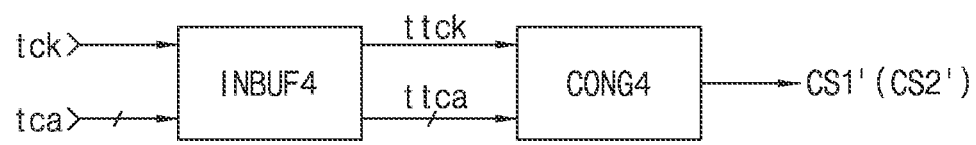
FIG. 7B shows a configuration of a controller of each memory die according to some examples of embodiments of the inventive concepts.

FIG. 7A shows a configuration of a controller of a buffer die according to some examples of embodiments of the inventive concepts. FIG. 7B shows a configuration of a controller of each memory die according to some examples of embodiments of the inventive concepts. A controller of each of the buffer die BD and the memory dies MD1 and MD2 may include an input buffer INBUF3 or INBUF4 and a control signal generator CONG3 or CONG4.

Referring to FIG. 7A, the input buffer INBUF3 may perform the same function as that of the input buffer INBUF1 illustrated in FIG. 3A. The control signal generator CONG3 may perform the same function as that of the control signal generator CONG1 illustrated in FIG. 3A to generate the third selection signal CS1' and the fourth selection signal CS2'.

Referring to FIG. 7B, the input buffer INBUF4 may perform the same function as that of the input buffer INBUF2 illustrated in FIG. 3B. The control signal generator CONG4 of each memory die MD1 and MD2 may perform the same function as that of the control signal generator CONG2 illustrated in FIG. 3B to generate the respective selection signal (the third selection signal CS1' for the first memory die MD1 and the fourth selection signal CS2' for the second memory die MD2).

Figure 8A:
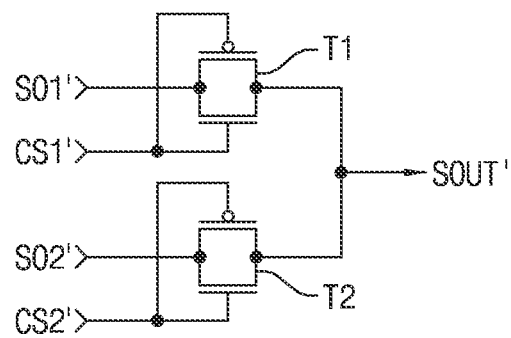
FIG. 8A is a diagram illustrating a configuration of a buffer die of a high bandwidth memory according to some examples of embodiments of the inventive concepts.

FIG. 8A is a diagram illustrating a configuration of a selector SELP' of a buffer die BD of a high bandwidth memory according to some examples of embodiments of the inventive concepts. The selector SELP' may include first and second transmission gates T1 and T2.

In FIG. 8A, a first transmission gate T1 may be turned on and may transmit the third scan output signal SO1' as the scan output signal SOUT' in response to the third selection signal CS1'. A second transmission gate T2 may be turned on and may transmit the fourth scan output signal SO2' as the scan output signal SOUT' in response to the fourth selection signal CS2'.

Figure 8B:
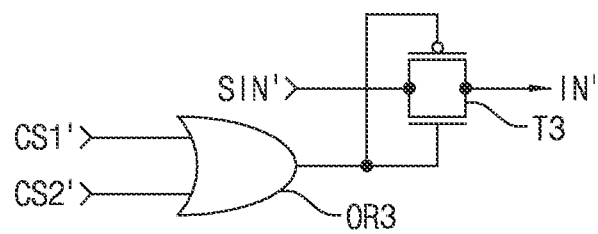
FIG. 8B is a diagram illustrating a configuration of an input unit of a buffer die of a high bandwidth memory according to some examples of embodiments of the inventive concept.

FIG. 8B is a diagram illustrating a configuration of an input unit INP' of a buffer die BD of a high bandwidth memory according to some examples of embodiments of the inventive concepts. The input unit INP' may include a third OR gate OR3 and a third transmission gate T3.

In FIG. 8B, the third OR gate OR3 may perform an OR operation on the third selection signal CS1' and the fourth selection signal CS2'. The third transmission gate T3 may be turned on to transmit the scan input signal SIN' and to generate the input signal IN' when an output signal of the third OR gate OR3 is activated and is at a "high" level. The scan input signal SIN' may be a ramp signal.

Figure 8C:
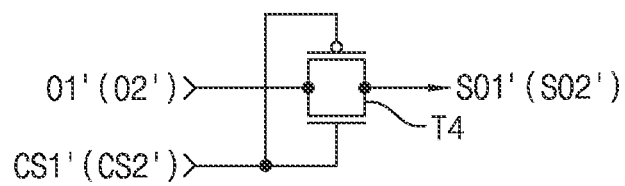
FIG. 8C is a diagram showing a configuration of an output unit of each memory die of a high bandwidth memory according to some examples of embodiments of the inventive concepts.

FIG. 8C is a diagram showing a configuration of an output unit OUTP' of each memory die of a high bandwidth memory according to some examples of embodiments of the inventive concepts. The output unit OUTP' may include a fourth transmission gate T4.

In FIG. 8C, the fourth transmission gate T4 may be turned on to transmit the third bump crack detection signal O1' (the fourth bump crack detection signal O2') as the third scan output signal SO1' (the fourth scan output signal SO2') when the third selection signal CS1' (the fourth selection signal CS2') is activated and is at a "high" level.

Each of the first to fourth transmission gates T1 to T4 illustrated in FIGS. 8A to 8C may be a CMOS transmission gate, although the present disclosure is not limited thereto.

Figure 9A:
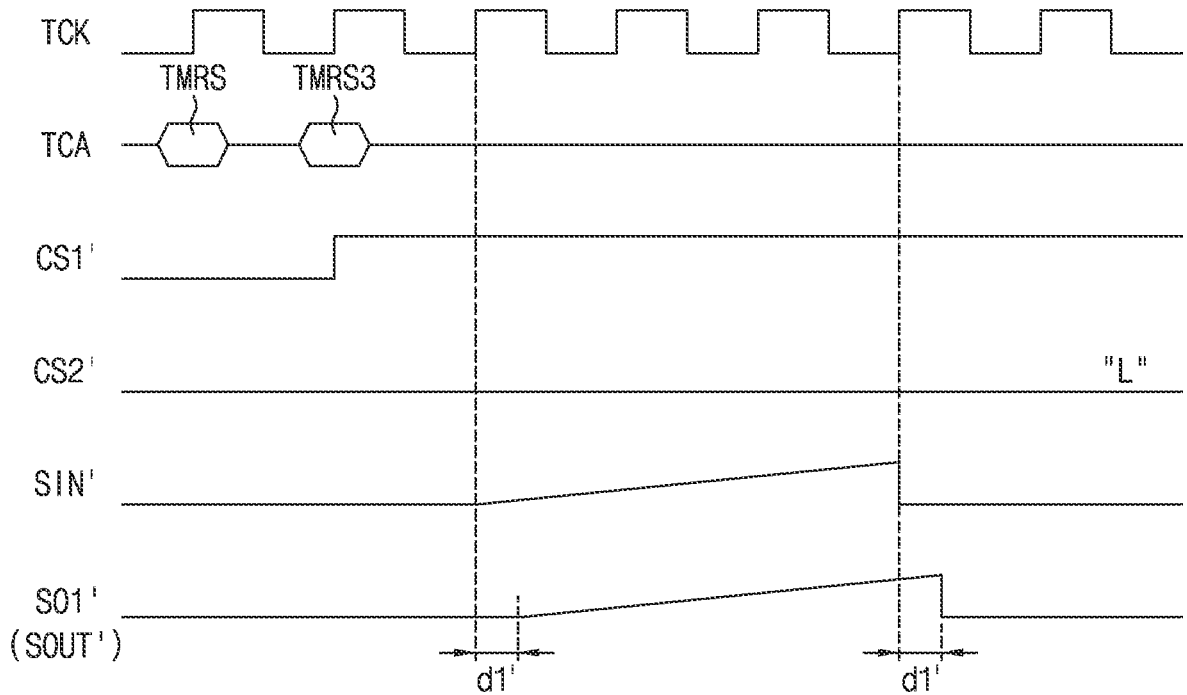
FIGS. 9A and 9B are operation timing diagrams for explaining a bump crack detection operation of a high bandwidth memory according to some examples of embodiments of the inventive concepts.
Figure 9B:
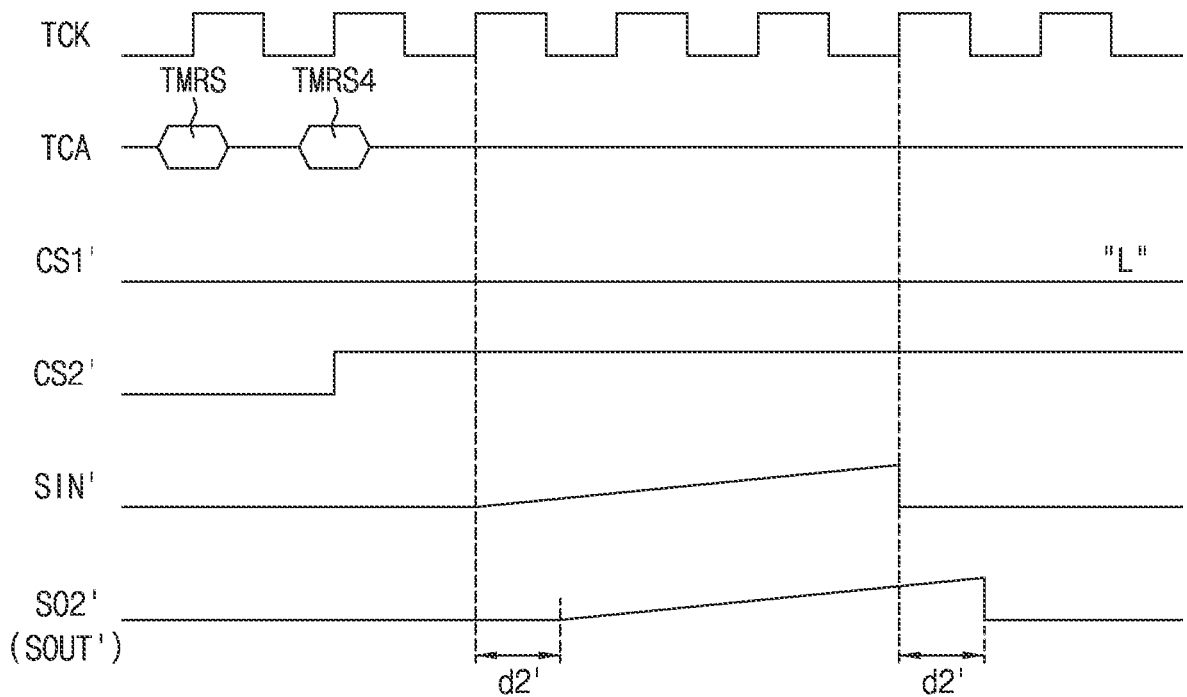

FIGS. 9A and 9B are operation timing diagrams for explaining a bump crack detection operation of a high bandwidth memory according to some examples of embodiments of the inventive concepts.

In the operation timing diagrams illustrated in FIGS. 9A and 9B, like in the above operation timing diagrams illustrated in FIGS. 5A and 5B, a high bandwidth memory may enter a test mode in response to the test mode entry code TMRS.

Referring to FIGS. 9A and 9B, unlike in the above operation timing diagrams illustrated in FIGS. 5A and 5B, after entering the test mode, when the test command and address TCA is a third test mode setting code TMRS3, the third selection signal CS1' at a "high" level and the fourth selection signal CS2' at a "low" level may be generated. On the other hand, when the test command and address TCA is a fourth test mode setting code TMRS4, the third selection signal CS1' at a "low" level and the fourth selection signal CS2' at a "high" level may be generated.

Then, when the scan input signal SIN' is applied to the input unit INP' of the buffer die BD from an external test device (not shown), the input unit INP' may receive the scan input signal SIN' and may transmit the input signal IN' to the dummy bump DMB11. The scan input signal SIN' may be a ramp signal.

Referring to FIGS. 1, and 6A to 9A, the scan input signal SIN' may be transmitted through the dummy bump DBM11, the signal line sl11, the dummy bump DMB12, the signal line sl12, . . . , the signal line sl18, and the dummy bump DMB19 and the third bump crack detection signal O1' may be generated as the third scan output signal SO1'. When each of the dummy bumps DMB11 to DMB19 does not short circuit (i.e., is not connected to an adjacent power bump) and is normal, the third scan output signal SO1' and the scan output signal SOUT' may be generated by delaying the scan input signal SIN' by a third predetermined time d1'.

Referring to FIGS. 1, and 6A to 9B, the scan input signal SIN' may be transmitted through the dummy bump DBM11, the signal line sl11, the dummy bump DMB12, the signal line sl12, . . . , the signal line sl18, and the dummy bump DMB19 and the third bump crack detection signal O1' may be generated. In addition, the third bump crack detection signal O1' may be transmitted through the dummy bump DBM21, the signal line sl21, the dummy bump DMB22, the signal line sl22, . . . , the signal line s218, and the dummy bump DMB29 and the fourth bump crack detection signal O2' may be generated as the fourth scan output signal SO2'. When the dummy bumps DMB11 to DMB29 and DMB21 to DMB29 do not short circuit (i.e., are not connected to an adjacent power bump) and are normal, the fourth scan output signal SO2' and the scan output signal SOUT' may be generated by delaying the scan input signal SIN' by a fourth predetermined time d2'.

The high bandwidth memory 100 described with reference to FIGS. 2A to 5B may detect open bump crack failure corresponding to a case in which dummy bumps are disconnected, and the high bandwidth memory 110 described with reference to FIGS. 6A to 9B may detect short bump crack failure corresponding to a case in which dummy bumps are connected to an adjacent power bump.

Although not shown, the high bandwidth memory may have arrangement of dummy bumps, power bumps, and signal lines of the high bandwidth memory 110 of FIGS. 6A and 6B, and may be configured by combining FIG. 3A to FIG. 7A, combining FIG. 3B to FIG. 7B, coupling FIG. 4A to FIG. 8A, combining FIG. 4B to FIG. 8B, and combining FIG. 4C to FIG. 8C. In this case, both open bump crack failure and short bump crack failure of the high bandwidth memory may be detected.

Figure 10:
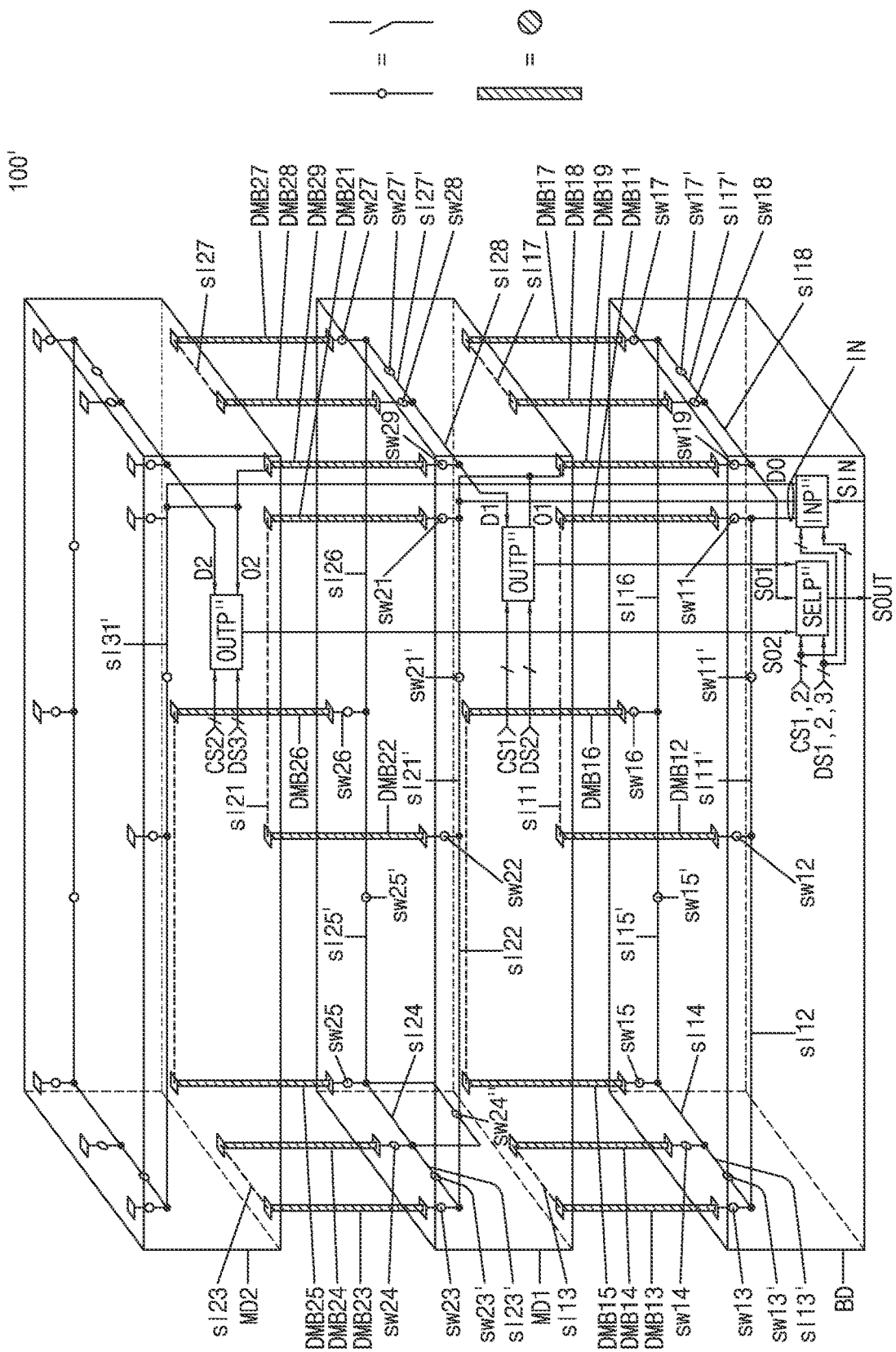
FIG. 10 is a lateral perspective view showing arrangement and some components of the dummy bumps and signal lines of a high bandwidth memory according to some examples of embodiments of the inventive concepts.

FIG. 10 is a lateral perspective view showing arrangement and some components of the dummy bumps and signal lines of a high bandwidth memory according to some examples of embodiments of the inventive concepts.

Referring to FIG. 10, the buffer die BD of a high bandwidth memory 100' may further include signal lines sl11', sl13', sl15', and sl17', switches sw11', sw13', sw15', and sw17' that are respectively included in the signal lines sl11', sl13', sl15', and sl17', and switches sw11 to sw19 between bottom surfaces of the dummy bumps DMB11 to DMB19 and signal lines sl11', (sl11', sl12), (sl12, sl13'), . . . , (sl17', sl18), and sl18 in addition to the buffer die BD of the high bandwidth memory 100 illustrated in FIG. 2B. Although not shown, each of the switches sw11', sw13', sw15', sw17', and sw11 to sw19 may be a CMOS transmission gate, although the present disclosure is not limited thereto.

The buffer die BD of the high bandwidth memory 100' may include a selector SELP''' and an input unit INP'''. The selector SELP''' may generate the first scan output signal SO1 in response to the first selection signal CS1 and may generate the second scan output signal SO2 in response to the second selection signal CS2 as the scan output signal SOUT during a bump crack test operation, and may generate a first die crack detection signal D0 in response to a first die selection signal DS1, may generate the first scan output signal SO1 in response to a second die selection signal DS2, and may generate the second scan output signal SO2 in response to a third die selection signal DS3 as the scan output signal SOUT during a die crack test operation. The input unit INP''' may receive the scan input signal SIN and may transmit the input signal IN to the dummy bump DMB11 in response to the first selection signal CS1 or the second selection signal CS2, may receive the scan input signal SIN and may transmit the input signal IN to the signal line sl11' in response to the first die selection signal DS1, may receive the scan input signal SIN and may transmit the input signal IN to the signal line sl21' in response to the second die selection signal DS2, and may receive the scan input signal SIN and may transmit the input signal IN to the signal line s131' in response to the third die selection signal DS3. The input unit INP''' may transmit the input signal IN through one of data bumps (not shown) for transmitting data between the buffer die BD and the memory die MD1, and may transmit the input signal IN through one of data bumps (not shown) for transmitting data between the buffer die BD and the memory die MD2.

The memory die MD1 of the high bandwidth memory 100' may further include signal lines sl21', sl23', sl25', and sl27', switches sw21', sw23', sw25', and sw27' that are respectively included in the signal lines sl21', sl23', sl25', and sl27', and switches sw21 to sw29 that are respectively between bottom surfaces of the dummy bumps DMB21 to DMB29 and signal lines sl21', (sl21', sl22), (sl22, sl23'), . . . , (sl27', sl28), and sl28 in addition to the memory die MD1 of the high bandwidth memory 100 illustrated in FIG. 2B. Although not shown, each of the sw21', sw23', sw25', sw27', and sw21 to sw29 may be a CMOS transmission gate, although the present disclosure is not limited thereto. The memory die MD1 of the high bandwidth memory 100' may include an output unit OUTP'''. The output unit OUTP''' may generate the first bump crack detection signal O1 as the first scan output signal SO1 in response to the first selection signal CS1 and may generate a second die crack detection signal D1 as the first scan output signal SO1 in response to the second die selection signal DS2.

The memory die MD2 of the high bandwidth memory 100' may have the same configuration as that of the memory die MD1 of the high bandwidth memory 100'. The memory die MD2 of the high bandwidth memory 100' may include the output unit OUTP'''. The output unit OUTP''' may generate the second bump crack detection signal O2 as the second scan output signal SO2 in response to the second selection signal CS2 and may generate a third die crack detection signal D2 as the second scan output signal SO2 in response to the third die selection signal DS3.

The high bandwidth memory 100' illustrated in FIG. 10 may perform the above bump crack test operation of the high bandwidth memory 100 illustrated in FIG. 2B.

Referring to FIG. 10, in the buffer die BD of the high bandwidth memory 100', when the first selection signal CS1 at a "high" level is generated, the switches sw11 to sw19 may be turned on and the switches sw11', sw13', sw15', and sw17' may be turned off. The subsequent bump crack test operation may be easily understood with reference to the above description of operations. In the memory die MD1 of the high bandwidth memory 100', when the second selection signal CS2 at a "high" level is generated, switches sw21 to sw29 may be turned on and the switches sw21', sw23', sw25', and sw27' may be turned off. The subsequent bump crack test operation may be easily understood with reference to the above description of operations.

In addition, the high bandwidth memory 100' illustrated in FIG. 10 may additionally perform a die crack test operation.

Referring to FIG. 10, in the buffer die BD of the high bandwidth memory 100', when the first die selection signal DS1 at a "high" level is generated, the switches sw11 to sw19 may be turned off and the switches sw11', sw13', sw15', and sw17' may be turned on. Then, the input unit INP''' may receive the scan input signal SIN and may output the input signal IN to the signal line sl11'. The scan input signal SIN may be transmitted through signal lines sl11', sl12, sl13', sl14, sl15', sl16, sl17', and sl18 and the first die crack detection signal D0 may be generated. The selector SELP''' may generate a first die crack detection signal D0 as the scan output signal SOUT.

In the memory die MD1 of the memory die MD1, when the second die selection signal DS2 at a "high" level is generated, the switches sw21 to sw29 may be turned on, and the switches sw21', sw23', sw25', and sw27' may be turned on. Then, when the scan input signal SIN is received, the scan input signal SIN may be transmitted through signal lines sl21', sl22, sl23', sl24, sl25', sl26, sl27', and sl28 and the second die crack detection signal D1 may be generated. The output unit OUTP''' may generate the second die crack detection signal D1 as the first scan output signal SO1.

In the memory die MD2 of the high bandwidth memory 100', when the third die selection signal DS3 at a "high" level is generated, the same operation as the memory die MD1 may be performed to generate the third die crack detection signal D2 as the second scan output signal SO2.

Figure 11A:
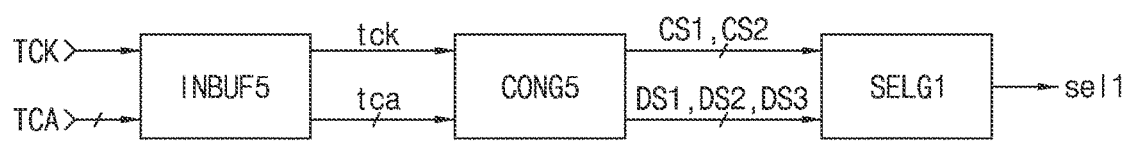
FIG. 11A is a diagram illustrating a configuration of a controller of a buffer die according to some examples of embodiments of the inventive concepts.
Figure 11B:
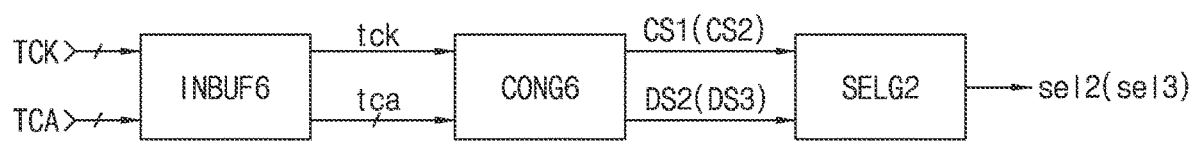
FIG. 11B is a diagram illustrating a configuration of a controller of each memory die according to some examples of embodiments of the inventive concepts.

FIG. 11A is a diagram illustrating a configuration of a controller of a buffer die according to some examples of embodiments of the inventive concepts. FIG. 11B is a diagram illustrating a configuration of a controller of each memory die according to some examples of embodiments of the inventive concepts. A controller of each of the buffer die BD and the memory dies MD1 and MD2 may include an input buffer INBUF5 or INBUF6, a control signal generator CONG5 or CONG6, and a selection signal generator SELG1 or SELG2.

Referring to FIG. 11A, the input buffer INBUF5 may perform the same function as that of the input buffer INBUF1 illustrated in FIG. 3A. The control signal generator CONG5 may receive the buffered test command and address tca and may activate one of the first selection signal CS1, the second selection signal CS2, and the first to third die selection signals DS1 to DS3 at a "high" level in response to the buffered test clock signal tck. When the first selection signal CS1 or the second selection signal CS2 is activated, the selection signal generator SELG1 may generate a first switching signal sel1 at a "high" level. Thus, the switches sw11 to sw19 may be turned on and the switches sw11', sw13', sw15', and sw17' may be turned off. When one of the first to third die selection signals DS1 to DS3 is activated, the selection signal generator SELG1 may generate the first switching signal sel1 at a "low" level. Thus, the switches sw11 to sw19 may be turned off and the switches sw11', sw13', sw15', and sw17' may be turned on.

Referring to FIG. 11B, the input buffer INBUF6 may perform the same function as that of the input buffer INBUF2 illustrated in FIG. 3B. The control signal generator CONG6 may receive the buffered test command and address tca and may activate one of the first selection signal CS1 (the second selection signal CS2) and the second die selection signal DS2 (the third die selection signal DS3) at a "high" level in response to the buffered test clock signal tck. When the first selection signal CS1 (the second selection signal CS2) is activated, the selection signal generator SELG2 may generate a second switching signal sel2 (a third switching signal sel3) at a "high" level. Thus, the switches sw21 to sw29 may be turned on and the switches sw21', sw23', sw25', and sw27' may be turned off. When the second die selection signal DS2 (the third die selection signal DS3) is activated, the selection signal generator SELG2 may generate the second switching signal sel2 (the third switching signal sel3) at a "low" level. Thus, the switches sw21 to sw29 may be turned off and the switches sw21', sw23', sw25', and sw27' may be turned on.

Figure 12:
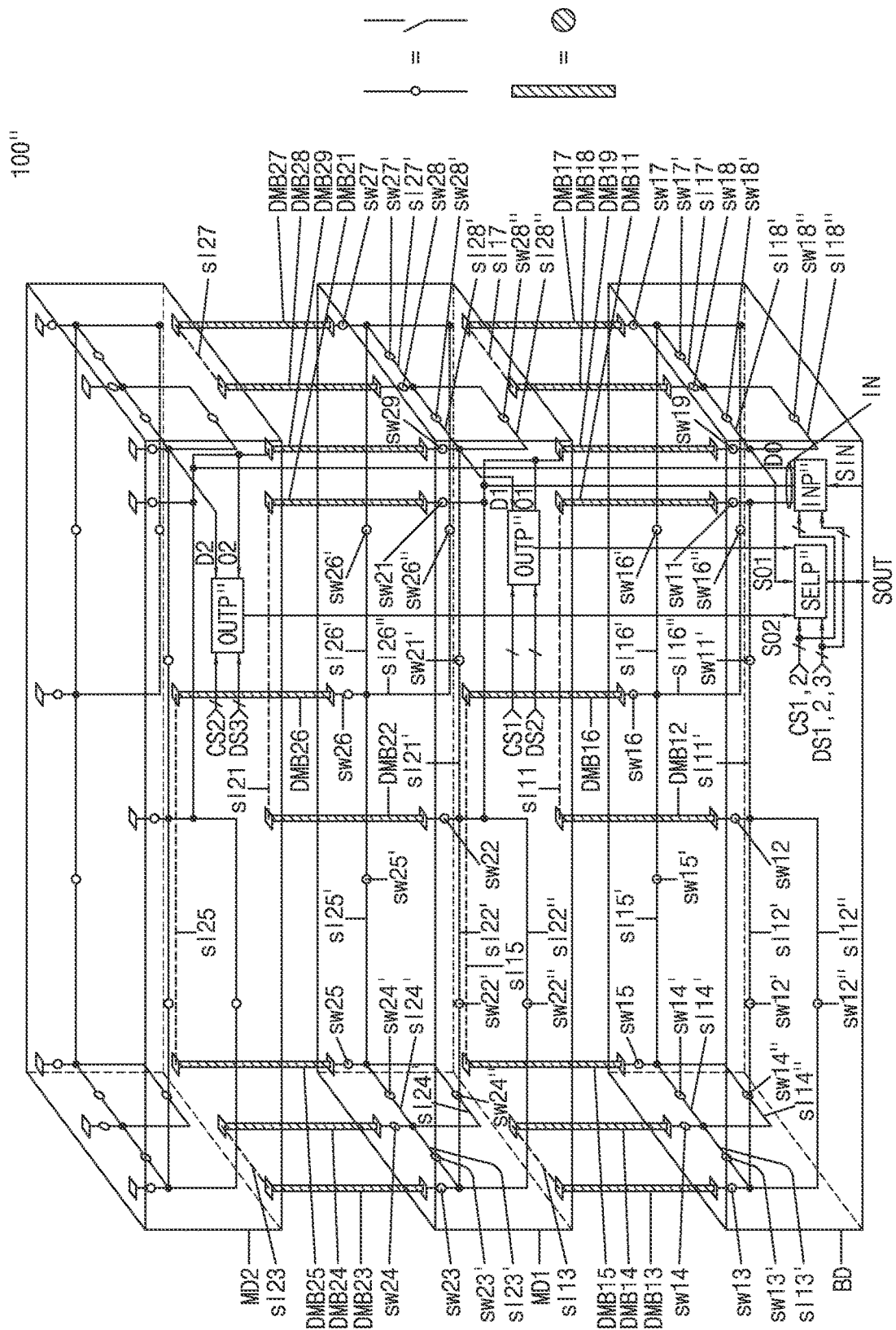
FIG. 12 is a lateral perspective view illustrating arrangement and some components of dummy bumps and signal lines of a high bandwidth memory according to some examples of embodiments of the inventive concepts.

FIG. 12 is a lateral perspective view illustrating arrangement and some components of dummy bumps and signal lines of a high bandwidth memory according to some examples of embodiments of the inventive concepts.

Referring to FIG. 12, the buffer die BD of a high bandwidth memory 100'' may be configured by replacing the signal lines sl12, sl14, sl16, and sl18 of the buffer die BD of the high bandwidth memory 100 illustrated in FIG. 10 with the signal lines sl12', sl14', sl16', and sl18', respectively, connecting the switches sw12', sw14', sw16', and sw18' to the inside of the signal lines sl12', sl14', sl16', and sl18', respectively, connecting the signal lines sl12', sl14', sl16', and sl18' in parallel to signal lines sl12'', sl14'', sl16'', and sl18'', respectively, and connecting switches sw12'', sw14'', sw16'', and sw18'' to the inside of the signal lines sl12'', sl14'', sl16'', and sl18'', respectively.

The memory die MD1 of the high bandwidth memory 100'' may be configured by replacing the signal lines sl22, sl24, sl26, and sl28 of the high bandwidth memory 100' illustrated in FIG. 10 with signal lines sl22', sl24', sl26', and sl28', respectively, connecting switches sw22', sw24', sw26', and sw28' to the inside of the signal lines sl22', sl24', sl26', and sl28', respectively, connecting signal lines sl22'', sl24'', sl26'', and sl28'' in parallel to the signal lines sl22', sl24', sl26', and sl28', respectively, and connecting switches sw22", sw24", sw26", and sw28" to the inside of the signal lines sl22", sl24", sl26", and sl28", respectively.

The memory die MD2 of the high bandwidth memory 100" may be configured in the same way as the memory die MD1 of the high bandwidth memory 100".

The buffer die BD of the high bandwidth memory 100" illustrated in FIG. 12 may be configured to transmit the scan input signal SIN through the dummy bump DMB11, the signal line sl11, the dummy bump DMB12, the signal line sl12, the dummy bump DMB13, the signal line sl13, the dummy bump DMB14, the signal line sl14, the dummy bump DMB15, the signal line sl15, the dummy bump DMB16, the signal line sl16, the dummy bump DMB17, the signal line sl17, the dummy bump DMB18, the signal line sl18, and the dummy bump DMB19 during a bump crack test operation. To this end, the selection signal generator SELG1 illustrated in FIG. 11A may generate the first switching signal sel1 at a "high" level in response to the first selection signal CS1, may turn on switches sw11 to sw19, sw12', sw14', sw16', and sw18', and may turn off the switches sw12", sw14", sw16", and sw18". The buffer die BD of the high bandwidth memory 100" illustrated in FIG. 12 may be configured to transmit the scan input signal SIN through signal lines sl11', sl12", sl13', sl14", sl15', sl16", sl17', and sl18" during a die crack test operation. To this end, the selection signal generator SELG1 illustrated in FIG. 11A may generate the first switching signal sel1 at a "low" level in response to the first die selection signal DS1, may turn on the switches sw11 to sw19, sw12', sw14', sw16', and sw18', and may turn on the switches sw12", sw14", sw16", and sw18".

The memory die MD1 of the high bandwidth memory 100" illustrated in FIG. 12 may be configured to transmit the scan input signal SIN through the dummy bump DMB21, the signal line sl21, the dummy bump DMB22, the signal line sl22, the dummy bump DMB23, the signal line sl23, the dummy bump DMB24, the signal line sl24, the dummy bump DMB25, the signal line sl25, the dummy bump DMB26, the signal line sl26, the dummy bump DMB27, the signal line sl27, the dummy bump DMB28, the signal line sl28, and the dummy bump DMB29 during a bump crack test operation. To this end, the selection signal generator SELG2 illustrated in FIG. 11B may generate the second switching signal se12 at a "high" level in response to the first selection signal CS1, may turn on the switches sw21 to sw29, sw22', sw24', sw26', and sw28', and may turn off the switches sw22", sw24", sw26", and sw28". The memory die MD1 of the high bandwidth memory 100" illustrated in FIG. 12 may be configured to transmit the scan input signal SIN through the signal lines sl21', sl22", sl22', sl24", sl25', sl26", sl27', and sl28" during a die crack test operation. To this end, the selection signal generator SELG2 illustrated in FIG. 11B may generate the second switching signal se12 at a "low" level in response to the second die selection signal DS2, may turn off the switches sw11 to sw19, sw12', sw14', sw16', and sw18', and may turn off the switches sw12", sw14", sw16", and sw18".

The memory die MD2 of the high bandwidth memory 100" illustrated in FIG. 12 may be easily understood with reference to the above description of operations of the memory die MD1.

Although not shown, power bump terminals and power bumps of the high bandwidth memory 110 of FIG. 6B may be added to the high bandwidth memory 100' or 100" illustrated in FIG. 10 or 12. In this case, the high bandwidth memory may detect short bump crack failure as well as open bump crack failure and die crack failure.

The high bandwidth memories 100, 110, 100', or 100" according to the aforementioned exemplary embodiments may be configured to detect open bump crack failure, short bump crack failure, and/or die crack failure of each of the dies BD, MD1, and MD2. However, although not shown, the high bandwidth memories 100, 110, 100', or 100" may also be configured to detect open bump crack failure, short bump crack failure, and/or die crack failure with respect to at least two regions (i.e., at least total six regions) of each of the dies BD, MD1, and MD2. As such, it may be possible to more accurately predict a position at which failure occurs.

Figure 13:
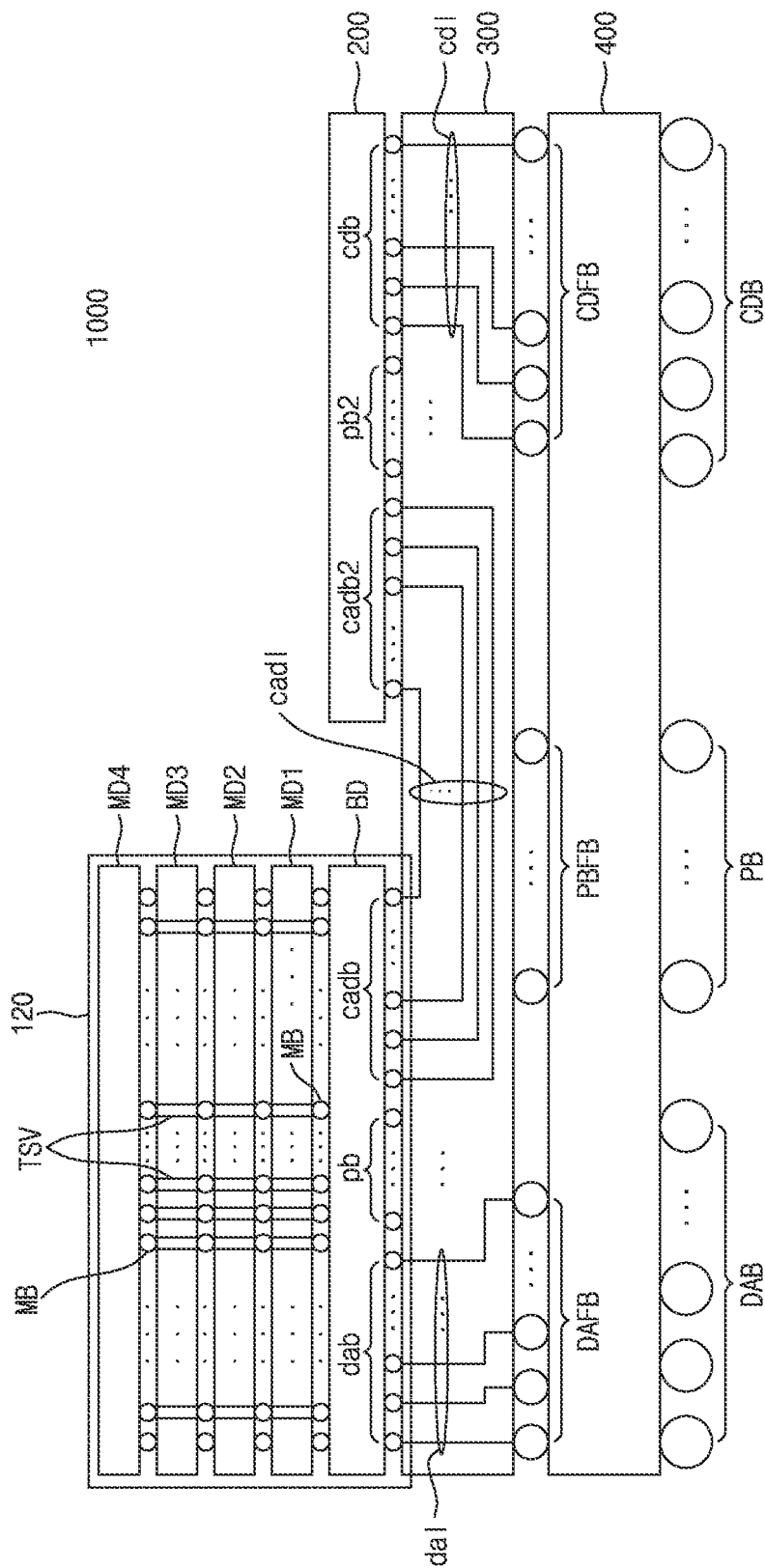
FIG. 13 is a diagram illustrating a configuration of a system including a high bandwidth memory according to some examples of embodiments of the inventive concepts.

FIG. 13 is a diagram illustrating a configuration of a system including a high bandwidth memory according to some examples of embodiments of the inventive concepts and illustrates a configuration of a system manufactured as a 2.5 dimension (D) package.

Referring to FIG. 13, a system 1000 may include a high bandwidth memory 120, a control device 200, an interposer 300, and a printed circuit board (PCB) 400.

The high bandwidth memory 120 may include memory dies MD1 to MD4 and the buffer die BD. The high bandwidth memory 120 may correspond to the high bandwidth memory 100, 100', 100", or 110 described with reference to FIGS. 1 to 12 except that memory dies MD3 and MD4 are additionally stacked.

Second command and address bumps and data bumps cadb2, second power bumps pb2, and first control signal and data bumps cdqb may be disposed on a bottom surface of the control device 200. The control device 200 may be a graphic processing unit (GPU) die, a central processing unit (CPU) die, a system on chip (SoC), or the like.

First bumps MB, first DA bumps dab, first and second power bumps pb and pb2, the first and second command and address bumps and data bumps cadb and cadb2, and first control signal and data bumps cdb may be micro bumps.

Second DA bumps DAFB, third power bumps PBFB, and second control signal and data bumps CDFB may be on a bottom surface of the interposer 300. The interposer 300 may include DA lines dal for connecting the first DA bumps dab to the second DA bumps DAFB, command and address lines and data lines cadl for connecting the first command and address bumps and data bumps cadb, second command and address bumps, and the data bumps cadb2, and control signal and data lines cdl for connecting the first control signal and data bumps cdb and the second control signal and data bumps CDFB. Although not shown, the interposer 300 may further include power lines for connecting the first power bumps pb and the third power bumps PBFB and connecting the second power bumps pb2 and the third power bumps PBFB. The second DA bumps DAFB, the third power bumps PBFB, and the second control signal and data bumps CDFB may be flip die bumps.

DA balls DAB, power balls PB, and control signal and data balls CDB may be on a bottom surface of the PCB 400. In the PCB 400, the second DA bumps DAFB and the DA balls DAB may be connected to each other, the third power bumps PBFB and the power balls PB may be connected to each other, and the second control signal and data bumps CDFB and the control signal and data balls CDB may be connected to each other.

In FIG. 13, during a bump crack test operation or a die crack test operation, an external test device (not shown) may apply a test clock signal, a test command and address, and a scan input signal and may output a scan output signal through the DA balls DAB. The test clock signal, the test command and address, and the scan input signal may be transmitted to input terminals of the first DA bumps dab through the PCB 400 and the interposer 300, and the scan output signal output through an output terminal of the first DA bumps dab may be output to the DA balls DAB through the interposer 300 and the PCB 400.

Although not shown, a system including the high bandwidth memory described with reference to FIGS. 1 to 12 may also be manufactured as a 3D package.

According to the some examples of embodiments of the inventive concepts, a high bandwidth memory and a system including the same may be capable of detecting die crack failure as well as open bump crack failure and/or short bump crack failure of bumps between a buffer die and a plurality of memory dies. Thus, the reliability of the memory and the system may be enhanced.

While some examples of embodiments of the inventive concepts have been described with reference to the accompanying drawings, it should be understood by those skilled in the art that various modifications may be made without departing from the scope of the inventive concepts. Therefore, the examples of embodiments described herein should be considered in a descriptive sense only and not for purposes of limitation.

What is claimed is:

1. A high bandwidth memory comprising:
   a buffer die;
   a plurality of memory dies stacked on the buffer die;
   a plurality of dummy bump groups in edge regions of the buffer die and the plurality of memory dies, wherein each of the plurality of dummy bump groups comprises the plurality of dummy bumps spaced apart from each other between each pair of adjacent dies and configured to connect the two adjacent dies to each other; and
   a plurality of signal line groups, each comprising a plurality of signal lines configured to transmit a corresponding signal among an input signal and a plurality of bump crack detection signals, applied to an input dummy bump of the plurality of dummy bumps of each of the plurality of dummy bump groups, to an output dummy bump of the plurality of dummy bumps via sequential transmission through the plurality of dummy bumps during a bump crack test operation,
   wherein a scan input signal applied to a first terminal of the buffer die is generated as the input signal, signals output through the output dummy bumps of the plurality of dummy bump groups are generated as the plurality of bump crack detection signals, and one selected from the plurality of bump crack detection signals is output to a scan output signal through a second terminal of the buffer die.

2. The high bandwidth memory of claim 1, wherein the plurality of dummy bumps of each of the plurality of dummy bump groups comprises first dummy bumps and second dummy bumps;
   wherein the input dummy bump and the output dummy bump are the first dummy bumps adjacent to each other; and
   wherein the second dummy bumps and the first dummy bumps alternate around a perimeter of the high bandwidth memory from a first side of the input dummy bump to a second side of the output dummy bump.

3. The high bandwidth memory of claim 2, wherein the plurality of signal lines of each of the plurality of signal line groups comprise:
   first signal lines, each configured to connect a first surface of a first dummy bump to a first surface of a respective second dummy bumps adjacent to the first dummy bump; and
   second signal lines, each configured to connect a second surface of a second dummy bump to a second surface of a respective first dummy bump adjacent to the first dummy bump,
   wherein the first signal lines are inside or on a bottom surface of an upper die of a pair of adjacent dies; and
   wherein the second signal lines are inside or on a top surface of a lower die of the pair of adjacent dies.

4. The high bandwidth memory of claim 1, wherein the buffer die is configured to receive the scan input signal and is configured to transmit the input signal to a first surface of the input dummy bump during the bump crack test operation; and
   wherein the plurality of dummy bumps of a first dummy bump group among the plurality of dummy bump group and the plurality of signal lines of a first signal line group among the plurality of signal line groups are configured to transmit the input signal to generate a first bump crack detection signal among the plurality of bump crack detection signals to a second surface of the output dummy bump of the first dummy bump group.

5. The high bandwidth memory of claim 4, wherein each of the plurality of memory dies is configured to receive the first bump crack detection signal or a second bump crack detection signal transmitted from a corresponding memory die stacked below and is configured to transmit the first bump crack detection signal or the second bump crack detection signal to the first surface of the input dummy bump stacked above during the bump crack test operation; and
   wherein each of the plurality of memory dies is configured to transmit the first bump crack detection signal or a corresponding one among the second bump crack detection signals to the buffer die.

6. The high bandwidth memory of claim 5, wherein the buffer die comprises a plurality of direct access terminals;
   wherein the plurality of direct access terminals including input terminals, the first terminal, and the second terminal, the input terminals are configured to receive a first command and address for the bump crack test operation, the first terminal is configured to receive the scan input signal, and the second terminal is configured to output the first bump crack detection signal or the corresponding one among the second bump crack detection signals.

7. The high bandwidth memory of claim 3, wherein each of the plurality of dummy bump groups further comprises a plurality of power bumps configured to transmit power.

8. The high bandwidth memory of claim 7, wherein the scan input signal is a pulse signal or a ramp signal.

9. The high bandwidth memory of claim 3, wherein each of the buffer die and the plurality of memory dies further comprises:
   third signal lines, each configured to connect a bottom surface of a first dummy bump to a bottom surface of a respective second dummy bump adjacent to the first dummy bump;
   first switches included in each of the third signal lines; and
   second switches, each configured to connect bottom surfaces of the plurality of dummy bumps to one of the third signal lines and one of the second signal lines,
   wherein a bump crack test operation signal is configured to open the first switches and close the second switches; and
   wherein a die crack test operation signal is configured to close the first switches, open the second switches, and generate a die crack detection signal via transmission of the scan input signal through the second and third signal lines.

10. The high bandwidth memory of claim 9, wherein each of the buffer die and the plurality of memory dies further comprises:
   third switches included in each of the third signal lines;
   fourth signal lines spaced apart from the second signal lines in parallel, respectively; and
   fourth switches included in each of the fourth signal lines,
   wherein the bump crack test operation signal is configured to open the fourth switches and close the third switches; and
   wherein the die crack test operation signal is configured to close the fourth switches, open the third switches, and generate the die crack detection signal via transmission of the scan input signal through the fourth signal lines.

11. A high bandwidth memory comprising:
   a buffer die;
   a plurality of memory dies stacked on the buffer die;
   a plurality of dummy bump groups in edge regions of the buffer die and the plurality of memory dies, wherein each of the plurality of dummy bump groups comprises the plurality of dummy bumps spaced apart from each other and connected between a first surface of one of a pair of adjacent dies and a second surface of the other of the pair of adjacent dies and a plurality of power bumps adjacent to the plurality of dummy bumps and configured to transmit power; and
   a plurality of signal line groups, each comprising a plurality of signal lines configured to transmit a corresponding signal among an input signal and a plurality of bump crack detection signals, applied to a first surface of an input dummy bump of the plurality of dummy bumps of each of the plurality of dummy bump groups, to an output dummy bump of the plurality of dummy bumps via sequential transmission through the plurality of dummy bumps during a bump crack test operation,
   wherein the plurality of dummy bumps of each of the plurality of dummy bump groups comprises first dummy bumps and second dummy bumps;
   wherein the input dummy bump and the output dummy bump are the first dummy bumps adjacent to each other; and
   wherein the second dummy bumps and the first dummy bumps are alternately arranged from a first side of the input dummy bump to a second side of the output dummy bump.

12. The high bandwidth memory of claim 11, wherein a scan input signal applied to a first terminal of the buffer die is generated as the input signal, signals output through the output dummy bumps of the plurality of dummy bump groups are generated as the plurality of bump crack detection signals, and one selected from the plurality of bump crack detection signals is output to a scan output signal through a second terminal of the buffer die,
   wherein the plurality of signal lines of each of the plurality of signal line groups comprise:
   first signal lines, each configured to connect a first surface of a first dummy bump to a first surface of a respective second dummy bump adjacent to the first dummy bump; and
   second signal lines, each configured to connect a second surface of a second dummy bump to a second surfaces of a respective first dummy bumps adjacent to the second dummy bump,
   wherein the first signal lines are inside or on a bottom surface of a first die of a pair of adjacent dies; and
   wherein the second signal lines are inside or on a top surface of a second die of the pair of adjacent dies.

13. The high bandwidth memory of claim 12, wherein the scan input signal is a pulse signal or a ramp signal.

14. The high bandwidth memory of claim 12, wherein, during the bump crack test operation, the buffer die is configured to receive the scan input signal and is configured to transmit the input signal to a bottom surface of the input dummy bump;
   wherein the plurality of dummy bumps of a first dummy bump group among the plurality of dummy bump group and the plurality of signal lines of a first signal line group among the plurality of signal line groups are configured to transmit the input signal to generate a first bump crack detection signal among the plurality of bump crack detection signals to a bottom surface of the output dummy bump of the first dummy bump group;
   wherein, during the bump crack test operation, each of the plurality of memory dies is configured to receive the first bump crack detection signal or a second bump crack detection signal transmitted from a corresponding memory die stacked below and is configured to transmit the first bump crack detection signal or the second bump crack detection signal to the bottom surface of the input dummy bump stacked above; and
   wherein each of the plurality of memory dies is configured to transmit the first bump crack detection signal or a corresponding one among the second bump crack detection signals to the buffer die.

15. The high bandwidth memory of claim 12, wherein each of the buffer die and the plurality of memory dies further comprises:
   third signal lines, each configured to connect a bottom surface of a first dummy bump to a bottom surface of a respective second dummy bump adjacent to the first dummy bump;
   first switches included in each of the third signal lines; and
   second switches, each configured to connect bottom surfaces of the plurality of dummy bumps to one of the third signal lines and one of the second signal lines,
   wherein a bump crack test operation signal is configured to open the first switches and close the second switches; and
   wherein a die crack test operation signal is configured to close the first switches, open the second switches, and generate a die crack detection signal via transmission of the scan input signal through the second and third signal lines.

16. The high bandwidth memory of claim 15, wherein each of the buffer die and the plurality of memory dies further comprises:
   third switches included in each of the third signal lines;
   fourth signal lines spaced apart from the second signal lines in parallel, respectively; and
   fourth switches included in each of the fourth signal lines,
   wherein the bump crack test operation signal is configured to open the fourth switches and close the third switches; and
   wherein the die crack test operation signal is configured to close the fourth switches, open the third switches, and generate the die crack detection signal via transmission of the scan input signal through the fourth signal lines.

17. A system comprising:
   a printed circuit board (PCB) comprising first direct access terminals;

an interposer stacked on the PCB and comprising second direct access terminals;
a control device stacked on the PCB; and
a high bandwidth memory stacked on the interposer and comprising third direct access terminals,
wherein the high bandwidth memory comprises:
a buffer die;
a plurality of memory dies stacked on the buffer die;
a plurality of dummy bump groups in edge regions of the buffer die and the plurality of memory dies, wherein each of the plurality of dummy bump groups comprises the plurality of dummy bumps spaced apart from each other between each pair of adjacent dies and configured to connect the two adjacent dies to each other; and
a plurality of signal line groups, each comprising a plurality of signal lines configured to transmit a corresponding signal among an input signal and a plurality of bump crack detection signals, applied to a first surface of an input dummy bump of the plurality of dummy bumps of each of the plurality of dummy bump groups, to a bottom surface of an output dummy bump of the plurality of dummy bumps via sequential transmission through the plurality of dummy bumps during a bump crack test operation,
wherein at least one of the first direct access terminals, at least one of the second direct access terminals, and at least one of the third direct access terminals are configured to apply a scan input signal to the input dummy bump, and
wherein a scan input signal applied to a first terminal of the buffer die is generated as the input signal, signals output through the output dummy bumps of the plurality of dummy bump groups are generated as the plurality of bump crack detection signals, and one selected from the plurality of bump crack detection signals is output to a scan output signal through a second terminal of the buffer die.

18. The system of claim 17, wherein the plurality of dummy bumps of each of the plurality of dummy bump groups comprises first dummy bumps and second dummy bumps;
wherein the input dummy bump and the output dummy bump are first dummy bumps adjacent to each other;
wherein the second dummy bumps and the first dummy bumps are alternately arranged from a first side of the input dummy bump to a second side of the output dummy bump,
wherein the plurality of signal lines of each of the plurality of signal line groups comprise:
first signal lines, each configured to connect a top surface of a first dummy bump to a top surface of a respective second dummy bumps adjacent to the first dummy bump; and
second signal lines, each configured to connect a bottom surface of a second dummy bump to a bottom surface of a respective first dummy bump adjacent to the second dummy bump, respectively,
wherein the first signal lines are inside or on a bottom surface of a first die of a pair of adjacent dies; and
wherein the second signal lines are inside or on a top surface of a second die of the pair of adjacent dies.

19. The system of claim 17, wherein, during the bump crack test operation, the buffer die is configured to receive the scan input signal and is configured to transmit the input signal to a bottom surface of the input dummy bump;
wherein the plurality of dummy bumps of a first dummy bump group among the plurality of dummy bump group and the plurality of signal lines of a first signal line group among the plurality of signal line groups are configured to transmit the input signal to generate a first bump crack detection signal among the plurality of bump crack detection signals to a bottom surface of the output dummy bump of the first dummy bump group;
wherein, during the bump crack test operation, each of the plurality of memory dies is configured to receive the first bump crack detection signal or a second bump crack detection signal transmitted from a corresponding memory die stacked below and is configured to transmit the first bump crack detection signal or the second bump crack detection signal to the bottom surface of the input dummy bump stacked above; and
wherein each of the plurality of memory dies is configured to transmit the first bump crack detection signal or a corresponding one among the second bump crack detection signals to the buffer die.

20. The system of claim 19, wherein each of the plurality of dummy bump groups further comprises a plurality of power bumps adjacent to the plurality of dummy bumps, respectively, and configured to transmit power.

* * * * *